United States Patent
Kim et al.

(10) Patent No.: US 12,002,651 B2
(45) Date of Patent: Jun. 4, 2024

(54) VOLTAGE WAVEFORM GENERATOR, WAFER PROCESSING APPARATUS AND PLASMA PROCESSING APPARATUS

(71) Applicant: SAMSUNG ELECTRONICS CO., LTD., Suwon-si (KR)

(72) Inventors: Hyunbae Kim, Yongin-si (KR); Hyejin Kim, Sejong-si (KR); Chanhee Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 448 days.

(21) Appl. No.: 17/158,231

(22) Filed: Jan. 26, 2021

(65) Prior Publication Data

US 2021/0407769 A1    Dec. 30, 2021

(30) Foreign Application Priority Data

Jun. 25, 2020   (KR) ........................ 10-2020-0078027

(51) Int. Cl.
*H01J 37/32* (2006.01)

(52) U.S. Cl.
CPC .. *H01J 37/32174* (2013.01); *H01J 37/32128* (2013.01); *H01J 37/32146* (2013.01); *H01J 37/32091* (2013.01); *H01J 37/32577* (2013.01)

(58) Field of Classification Search
CPC ........... H01J 37/32082; H01J 37/32091; H01J 37/321; H01J 37/32128; H01J 37/32137; H01J 37/32146; H01J 37/32155; H01J 37/32174; H01J 37/32357; H01J 37/32577; C23C 16/505; C23C 16/507; C23C 16/509; C23C 16/5093; C23C 16/5096

See application file for complete search history.

(56) References Cited

U.S. PATENT DOCUMENTS

| | | | |
|---|---|---|---|
| 5,315,260 A | 5/1994 | Link et al. | |
| 6,445,598 B1 | 9/2002 | Yamada | |
| 6,469,919 B1 * | 10/2002 | Bennett | H01J 37/32082 363/56.02 |
| 6,472,822 B1 * | 10/2002 | Chen | H01J 37/32174 315/111.21 |
| 7,019,986 B2 | 3/2006 | Yokoyama et al. | |
| 7,843,087 B2 | 11/2010 | Ryoo et al. | |
| 8,736,175 B2 * | 5/2014 | Long | H01J 37/32935 315/111.21 |
| 8,780,598 B2 | 7/2014 | Endo | |
| 9,767,988 B2 * | 9/2017 | Brouk | H01J 37/32174 |

(Continued)

FOREIGN PATENT DOCUMENTS

| | | |
|---|---|---|
| JP | 0845762 A | 2/1996 |
| JP | 2008160905 A | 7/2008 |
| KR | 108020171 B1 | 4/2008 |

*Primary Examiner* — Kurt Sweely
(74) *Attorney, Agent, or Firm* — Sughrue Mion, PLLC

(57) ABSTRACT

A wafer processing apparatus includes a chamber, and a voltage waveform generator configured to accelerate plasma ions of the chamber, the voltage waveform generator includes: a pulse circuit configured to apply a chamber voltage, which is a pulse voltage, to the chamber by adjusting a chamber current applied to the chamber; and a slope circuit configured to generate a slope in an on-duty of the chamber voltage, which is the pulse voltage, and the pulse circuit includes a first inductive element configured to store a first internal current.

20 Claims, 22 Drawing Sheets

(56) References Cited

U.S. PATENT DOCUMENTS

| | | | |
|---|---|---|---|
| 10,157,729 B2 * | 12/2018 | Valcore, Jr. | H01J 37/32082 |
| 2018/0032100 A1 * | 2/2018 | Kim | G06F 1/06 |
| 2018/0286636 A1 * | 10/2018 | Ziemba | H01J 37/241 |

* cited by examiner

US 12,002,651 B2

VOLTAGE WAVEFORM GENERATOR, WAFER PROCESSING APPARATUS AND PLASMA PROCESSING APPARATUS

CROSS-REFERENCE TO THE RELATED APPLICATION

This application is based on and claims priority under 35 U.S.C. § 119 to Korean Patent Application No. 10-2020-0078027, filed on Jun. 25, 2020, in the Korean Intellectual Property Office, the disclosure of which is incorporated by reference herein in its entirety.

BACKGROUND

The inventive concept relates to a voltage waveform generator, a wafer processing apparatus, and a plasma processing apparatus.

A process for manufacturing a semiconductor device include a plasma process including plasma-induced deposition, plasma etching, and plasma cleaning. With the recent miniaturization and high integration of semiconductor devices, the influence of a fine error in a plasma process upon the quality of semiconductor products is increasing. Accordingly, various studies are being conducted to improve the precision and reliability of a plasma process by precisely controlling the energy of plasma in plasma equipment.

SUMMARY

The inventive concept has been made in an effort to provide a voltage waveform generator capable of improving the performance of semiconductor equipment by generating an arbitrary waveform set by a user, a wafer processing apparatus and a plasma processing apparatus using the same.

Another object of the inventive concept is to provide a voltage waveform generator capable of controlling ion energy of plasma by providing power having an arbitrary waveform set by a user, a wafer processing apparatus, and a plasma processing apparatus.

According to an aspect of the disclosure, there is provided a wafer processing apparatus comprising: a chamber configured to load a wafer; a radio frequency (RF) power source configured to generate plasma ions in the chamber; and a voltage waveform generator configured to accelerate the plasma ions toward the wafer, wherein the voltage waveform generator comprises: a pulse circuit comprising a first inductive element configured to store a first internal current, the pulse circuit being configured to apply a pulse voltage to the chamber by adjusting a chamber current applied to the chamber; and a slope circuit configured to generate a slope in an on-duty of the pulse voltage.

According to another aspect of the disclosure, there is provided a plasma processing apparatus comprising: a chamber in which a plasma process is performed; and a voltage waveform generator configured to apply a non-sinusoidal periodic wave voltage to the chamber, wherein the voltage waveform generator comprises: a pulse circuit configured to apply a pulse voltage to the chamber by applying a first output current to the chamber; and a slope circuit configured to generate a slope in an on-duty of the pulse voltage, by applying a second output current to the chamber.

According to another aspect of the disclosure, there is provided a plasma processing apparatus comprising a voltage waveform generator configured to apply a chamber voltage which is a non-sinusoidal periodic wave to a plasma chamber, wherein the voltage waveform generator comprises: a pulse circuit comprising a first inductive element configured to store a first internal current; and a slope circuit comprising a second inductive element configured to store a second internal current, wherein the pulse circuit is configured to apply the first internal current to the plasma chamber to generate a pulse in the chamber voltage, and the slope circuit is configured to apply the second internal current to the plasma chamber to generate a slope in an on-duty of the pulse.

According to another aspect of the disclosure, there is provided a voltage waveform generator comprising: a pulse circuit comprising a first inductive element configured to store a first internal current; a slope circuit comprising a second inductive element configured to store a second internal current; and a controller configured to: control the pulse circuit to apply the first internal current to a plasma chamber to generate a pulse in a chamber voltage, and control the slope circuit to apply the second internal current to the plasma chamber to generate a slope in an on-duty of the pulse.

According to another aspect of the disclosure, there is provided a method of generating a voltage waveform comprising: controlling a pulse circuit to apply a first internal current, which is stored in a first inductive element, to a plasma chamber to generate a pulse in a chamber voltage, and controlling a slope circuit to apply a second internal current, which is stored in a second inductive element, to the plasma chamber to generate a slope in an on-duty of the pulse.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
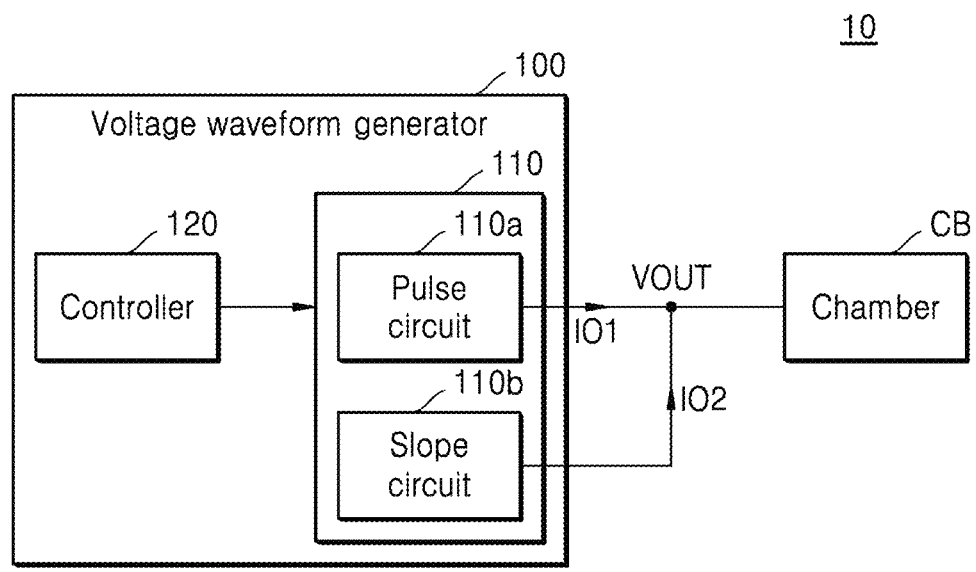
FIG. 1 is a block diagram schematically illustrating a wafer processing apparatus according to an example embodiment.

Hereinafter, embodiments of the inventive concept will be described in detail with reference to the accompanying drawings. Like reference numerals may refer to like components throughout the drawings, and repeated descriptions of the like components will be omitted.

FIG. 1 is a block diagram schematically illustrating a plasma processing apparatus 10 according to an example embodiment.

Referring to FIG. 1, the plasma processing apparatus 10 may include a voltage waveform generator 100 and a chamber CB. The plasma processing apparatus 10 may perform any one of ion beam etching, deposition of a plasma-based material layer, and ion cleaning on a processing target. According to an example embodiment, the processing target may be a wafer. Hereinafter, for convenience of explanation, it will be assumed that a wafer to be processed is arranged in the chamber CB and the plasma processing apparatus 10 is an apparatus for processing the wafer. However, this is merely an example, and does not limit the technical spirit of the inventive concept in any form.

The voltage waveform generator 100 may generate an output voltage VOUT having a waveform and may provide the generated output voltage VOUT to the chamber CB. According to an example embodiment, the waveform may be a set waveform. The set waveform of the output voltage VOUT may have, for example, a frequency of several kHz to several MHz, and may be a non-sinusoidal wave within a range of several tens of V to several tens of kV. The voltage waveform generator 100 may accelerate ions included in plasma in the chamber CB based on the output voltage VOUT to set energy of the ions reaching the wafer. The voltage waveform generator 100 may enable the energy of the ions to be distributed in a narrow energy band.

The voltage waveform generator 100 may include a voltage generator 110 and a controller 120. The voltage generator 110 may include a circuit device for generating the output voltage VOUT. The controller 120 may be a circuit for controlling the voltage generator 110.

The voltage generator 110 may include at least one pulse circuit 110a and at least one slope circuit 110b. According to some embodiments, the pulse circuit 110a may generate and output a first output current IO1. The first output current IO1 may be a pulse current having a variable amplitude, and the pulse circuit 110a may be a variable constant current source. The pulse circuit 110a may be a circuit for applying a square wave output voltage VOUT to the chamber CB. According to an example embodiment, the square wave may have the output voltage VOUT for the on-duty lower than the output voltage VOUT for the off-duty. However, the disclosure is not limited thereto, and as the voltage VOUT may have a various duty cycles.

According to an example embodiment, the pulse circuit 110a may output the first output current IO1 having a first amplitude during a first interval during which a first plasma process (for example, process P120 of FIG. 13) is performed, and may output the first output current IO1 having a second amplitude different from the first amplitude during a second interval during which a second plasma process (for example, process P160 of FIG. 13) is performed. The pulse circuit 110a may output the first output current IO1 having a positive value or the first output current IO1 having a negative value.

Figure 6:
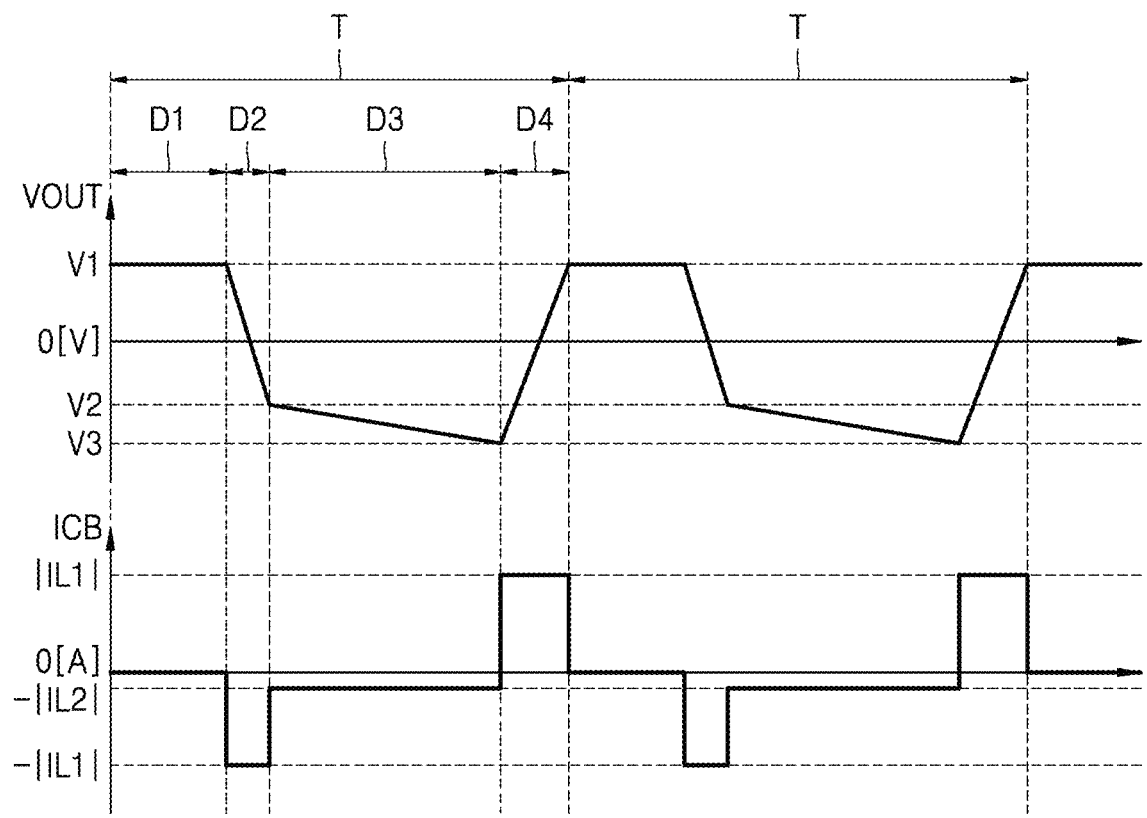
FIG. 6 is a graph illustrating a change in an output voltage of a voltage generator in accordance with time.

According to an example embodiment, the pulse circuit 110a may apply the first output current IO1 having a negative value to the chamber CB during a set first time interval (for example, a second interval D2 of FIG. 6), and then may apply the first output current IO1 having the same amplitude and an opposite direction (that is, the first output current IO1 having a positive value) to the chamber CB during a subsequent set second time interval (for example, a fourth interval D4 of FIG. 6).

The slope circuit 110b may generate a second output current IO2 having a variable amplitude. The slope circuit 110b may be a circuit for generating a slope in the on-duty of the square wave of the output voltage VOUT. Accordingly, the output voltage VOUT in which a slope is generated in the on-duty of the square wave may be applied to the chamber CB. The second output current IO2 may be a pulse current having a variable amplitude, and the slope circuit 110b may be a variable constant current source. As described below, the chamber CB may be modeled as a capacitive load, in which case the voltage VOUT applied to the chamber CB may vary according to amplitudes and application times of the first and second output currents IO1 and IO2 applied to the chamber CB.

According to an example embodiment, the voltage generator 110 may apply the first and second output currents IO1 and IO2, which are pulse-shaped currents, to the chamber CB in various orders such that the voltage VOUT having the set waveform may be applied to the chamber CB. For example, the voltage generator 110 may apply the first output current IO1 having a first pulse shape to the chamber CB to drop the voltage of the chamber CB from an initial voltage relatively rapidly, may apply the second output current IO2 having a second pulse shape to the chamber CB to drop the voltage of the chamber CB relatively slowly, and may apply the first output current IO1 having a third pulse shape to the chamber CB in a direction opposite to that of the first pulse shape to increase the voltage of the chamber CB rapidly to reach the initial voltage level.

The controller 120 may control the overall operation of the plasma processing apparatus 10. The controller 120 may control the first and second output currents IO1 and IO2 of the pulse circuit 110a and the slope circuit 110b. The controller 120 may be a computing device such as a work station computer, a desktop computer, a laptop computer, a tablet computer, or the like. The controller 120 may be configured as separate hardware devices or separate software applications included in one hardware device. The controller 120 may be a simple controller, a complex processor such as a microprocessor, a CPU or a GPU, a software-configured processor, dedicated hardware, or firmware. The controller 120 may be implemented by, for example, a general-purpose computer or application-specific hardware such as a digital signal processor (DSP), a field programmable gate array (FPGA) or an application-specific integrated circuit (ASIC), and so forth.

According to an example embodiment, an operation of the controller 120 may be implemented by instructions stored on a machine-readable medium that may be read and executed by one or more processors. Here, the machine-readable medium may include a mechanism for storing and/or transmitting information in a form readable by a machine (for example, a computing device). For example, the machine-readable medium may include read only memory (ROM), random access memory (RAM), a magnetic disk storage medium, an optical storage medium, flash memory devices, an electrical, optical, acoustic, or other type of radio wave signal (for example, a carrier wave, an infrared signal, or a digital signal), and any other signal.

In addition, firmware, software, routines, and instructions may be configured to perform the operations of the controller 120 or any process described below. For example, the controller 120 may be implemented by software that performs a function of determining outputs of the pulse circuit 110a and the slope circuit 110b, amplitudes of the first and second output currents IO1 and IO2, and directions (that is, polarities) of the first and second output currents IO1 and IO2. However, this is for convenience of explanation, and it should be understood that the above-described operation of the controller 120 may be caused by a computing device, a processor, a controller, or another device executing firmware, software, routines, instructions, etc.

Figure 2:
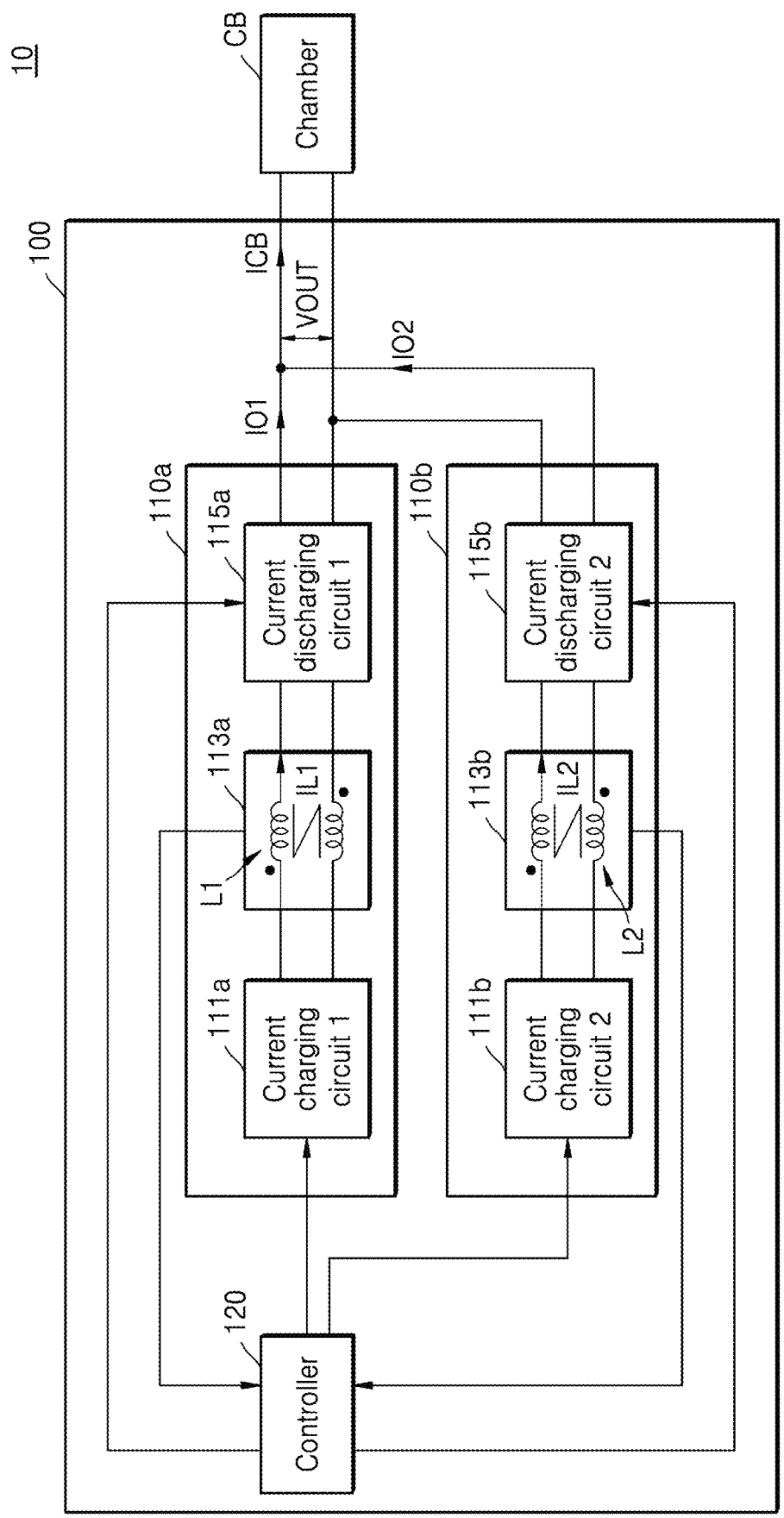
FIG. 2 is a block diagram schematically illustrating a wafer processing apparatus according to an example embodiments.

FIG. 2 is a detailed block diagram of the plasma processing apparatus 10 according to an example embodiment.

Referring to FIG. 2, the pulse circuit 110a may include a first current charging circuit 111a, a first current storage circuit 113a, and a first current discharging circuit 115a, and the slope circuit 110b may include a second current charging circuit 111b, a second current storage circuit 113b, and a second current discharging circuit 115b.

The first current charging circuit 111a may charge a first internal current IL1 in the first current storage circuit 113a. The first current charging circuit 111a may increase the first internal current IL1 to a set value. The first current charging circuit 111a may maintain the first internal current IL1 at the set value while the plasma process is performed. The controller 120 may control the first current charging circuit 111a to maintain the first internal current IL1 at a constant value by performing a feedback operation based on a measured value of the first internal current IL1. The first current charging circuit 111a may charge the first internal current IL1 to have a first current value in a first process, and may charge the first internal current IL1 to have a second current value in a second process, the second current value being different from the first current value. As described below, the first internal current IL1 may have a different value according to a height of a pulse of the output voltage VOUT to be implemented.

The first current storage circuit 113a may include a first inductive element L1. According to an example embodiment, the first inductive element L1 may include a plurality of inductively coupled inductors. The first inductive element L1 may have an inductance relatively high with respect to the number of windings due to inductive coupling. For example, the first inductive element L1 may have an inductance of about 0.1 mH to about 10 H. Accordingly, the first current storage circuit 113a may be compact and have a high current storage capacity. The amplitude of the first internal current IL1 may be maintained to be substantially constant by the first inductive element L1 during the process. However, the amplitude of the first internal current IL1 is not limited thereto, and may vary according to process conditions.

According to an example embodiment, the first current discharging circuit 115a may apply the first output current IO1 to the chamber CB by outputting the first internal current IL1 stored in the first current storage circuit 113a. According to an example embodiment, the first current discharging circuit 115a may be a three-level pulse current source. The first current discharging circuit 115a may apply the first output current IO1 to the chamber CB in a variable direction. Accordingly, the first output current IO1 may have the same absolute value as that of the first internal current ILL and may have the same or opposite sign to that of the first internal current ILL In addition, the first current discharging circuit 115a may provide a path through which the first internal current IL1 may freewheel (flyback) such that the output current IO1 may have a value of 0.

According to an example embodiment, the second current charging circuit 111b may charge a second internal current IL2 in the second current storage circuit 113b. The second current charging circuit 111b may increase the second internal current IL2 to a set value. The second current charging circuit 111b may maintain the second internal current IL2 at the set value. The controller 120 may control the second current charging circuit 111b to maintain the second internal current IL2 at a constant value by performing a feedback operation based on a measured value of the second internal current IL2. The second current charging circuit 111b may charge the second internal current IL2 to have a third current value in the first process, and may charge the second internal current IL2 to have a fourth current value in the second process, the fourth current value being different from the third current value. As described below, the second internal current IL2 may have a different value according to a gradient of a slope of the output voltage VOUT to be implemented.

The second current storage circuit 113b may include a second inductive element L2 including a plurality of inductively coupled inductors, and accordingly, the second current storage circuit 113b may be compact and have a high current storage capacity. For example, the second inductive element L2 may have an inductance of about 0.1 mH to about 10 H. By the second inductive element L2, the amplitude of the second internal current IL2 may be maintained to be substantially constant during the process. However, the amplitude of the second internal current IL2 is not limited thereto, and may vary according to process conditions. The second internal current IL2 may have an amplitude lower than that of the first internal current IL1. The amplitude of the second internal current IL2 may be in a range of about $\frac{1}{100}$ to about ½ of the amplitude of the first internal current ILL but is not limited thereto. As such, according to another example embodiment, the amplitude of the second internal current IL2 may be in a different range than the amplitude of the first internal current IL1.

An output port of the second current discharging circuit 115b may be connected in parallel with an output port of the first current discharging circuit 115a. The second current discharging circuit 115b may apply the second output current IO2 to the chamber CB by outputting the second internal current IL2 stored in the second current storage circuit 113b. The second current discharging circuit 115b may be different from the first current discharging circuit 115a. The second current discharging circuit 115b may output the second output current IO2 in only one direction. In this case, the second output current IO2 may have a value of 0 [A] or a negative value, but is not limited thereto. For example, the second current discharging circuit 115b may be substantially the same as the first current discharging circuit 115a. In an example, the second output current IO2 may be a pulse current.

According to an example embodiment, a chamber current ICB applied to the chamber CB may be equal to a sum of the first output current IO1 and the second output current IO2. As described below, the chamber CB may be modeled as a capacitive load, in which case the chamber current ICB applied to the chamber CB may change the output voltage VOUT applied to the chamber CB. For example, the chamber current ICB having a negative value may be applied to the chamber CB, and accordingly, the output voltage VOUT may be changed to a positive voltage having a lower absolute value, or a negative voltage having a higher absolute value. As another example, the chamber current ICB having a positive value may be applied to the chamber CB, and accordingly, the output voltage VOUT may be changed to a negative voltage having a lower absolute value, or a positive voltage having a higher absolute value.

Figure 3A:
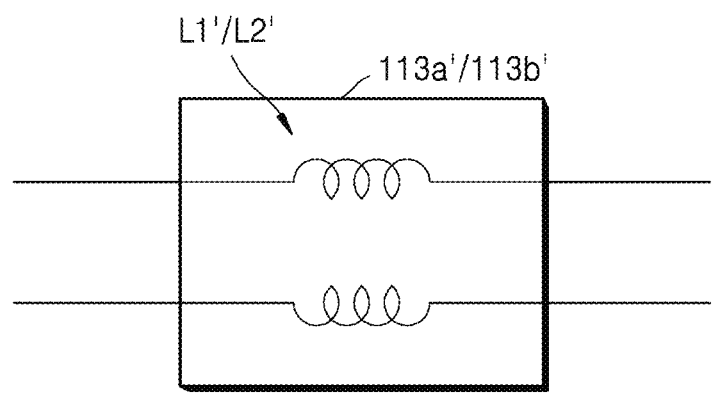
FIGS. 3A and 3B are diagrams for explaining current storage circuits according to an example embodiment.
Figure 3B:
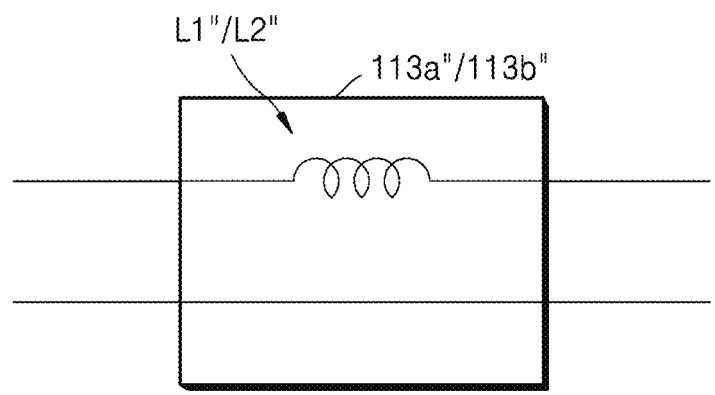

FIGS. 3A and 3B are diagrams for explaining current storage circuits 113a', 113b', 113a", and 113b" according to some exemplary embodiments.

For convenience of illustration, components other than the current storage circuits 113a', 113b', 113a", and 113b" are not shown in FIGS. 3A and 3B.

Referring to FIG. 3A, unlike in FIG. 2, each of the first and second inductive elements L1' and L2' may include a plurality of inductors that are not inductively coupled to each other.

Referring to FIG. 3B, unlike in FIG. 2, each of the first and second inductive elements L1" and L2" may be configured as a single inductor.

Figure 4:
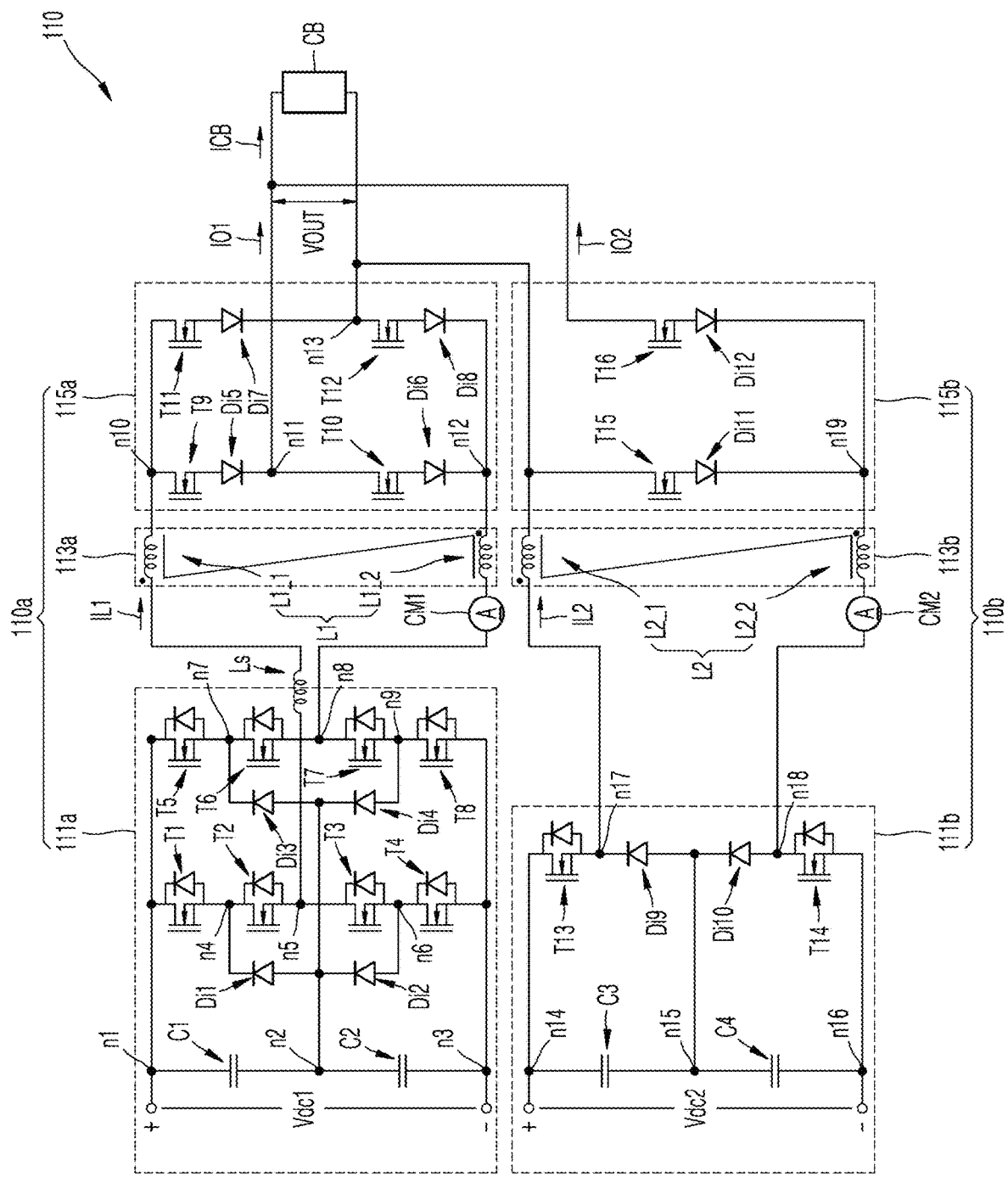
FIG. 4 is a circuit diagram illustrating an example of a voltage generator according to an example embodiment.

FIG. 4 is a circuit diagram illustrating an example of the voltage generator 110 according to an example embodiment.

Referring to FIG. 4, each of the pulse circuit 110a and the slope circuit 110b may be a voltage-current converting circuit. The pulse circuit 110a may have a structure in which the first current charging circuit 111a, the first current storage circuit 113a, and the first current discharging circuit 115a are cascaded together. According to an example embodiment, each of the first current charging circuit 111a, the first current storage circuit 113a, and the first current discharging circuit 115a is a two-port network. Similarly, the slope circuit 110b may have a structure in which the second current charging circuit 111b, the second current storage circuit 113b, and the second current discharging circuit 115b are cascaded together. According to an example embodiment, each of the second current charging circuit 111b, the second current storage circuit 113b, and the second current discharging circuit 115b is a two-port network.

The first current charging circuit 111a and the second current charging circuit 111b may output a pulse voltage via output ports based on direct current (DC) power sources Vdc1 and Vdc2 applied to input ports (left ports in the circuit diagram).

According to an example embodiment, the first current charging circuit 111a may be a converter circuit including a full bridge three-level neutral point clamped (NPC) topology. However, the first current charging circuit 111a is not limited thereto, and may include any converter circuit capable of outputting voltages of different levels.

The first current storage circuit 113a may include the first inductive element L1, and the second current storage circuit 113b may include the second inductive element L2. An output voltage of the first current charging circuit 111a may be applied through an input port of the first current storage circuit 113a, and the first internal current IL1 flowing through the first inductive element L1 may be charged by the output voltage of the first current charging circuit 111a. The first internal current IL1 may be output to the first current discharging circuit 115a through an output port of the first current storage circuit 113a. An output voltage of the second current charging circuit 111b may be applied through an input port of the second current storage circuit 113b, and the second internal current IL2 flowing through the second inductive element L2 may be charged by the output voltage of the second current charging circuit 111b. The second internal current IL2 may be output to the second current discharging circuit 115b through an output port of the second current storage circuit 113b.

The first current charging circuit 111a may charge the first inductive element L1 such that the first internal current IL1 may have a substantially constant value by using a value of the first internal current IL1 measured by a first current meter CM1 as a feedback signal. The second current charging circuit 111b may charge the second inductive element L2 such that the second internal current IL2 may have a substantially constant value by using a value of the second internal current IL2 measured by a second current meter CM2 as a feedback signal.

The first and second current discharging circuits 115a and 115b may output the first and second internal currents IL1 and IL2 as the first and second output currents IO1 and IO2, respectively. The first current discharging circuit 115a may provide a path through which the first internal current IL1 may freewheel without being output to the chamber CB. Here, freewheeling refers to a state in which the first internal current IL1 is not applied to an external load (that is, the chamber CB) and flows along a closed path without a substantial load. The first current discharging circuit 115a may provide a path through which the first internal current IL1 may be output to the chamber CB.

The first current discharging circuit 115a may provide a variable path that may allow the first internal current IL1 to enter a first terminal of the chamber CB or to enter a second terminal opposite to the first terminal. In the case where the first internal current IL1 enters the first terminal (for example, a terminal connected to a first node n11) of the chamber CB, the first output current IO1 may be substantially the same as the first internal current IL'. In the case where the first internal current IL1 enters the chamber CB through the second terminal (for example, a terminal connected to a thirteenth node n13) of the chamber CB, the first output current IO1 may have substantially the same amplitude as that of the first internal current IL1 and have a sign opposite to that of the first internal current IL'.

The second current discharging circuit 115b may provide a path through which the second internal current IL2 may freewheel such that the second internal current IL2 is not output to the chamber CB. The second current discharging circuit 115b may provide a path through which the second internal current IL2 is output to the chamber CB.

The first current charging circuit 111a may include first and second capacitors C1 and C2, first to fourth diodes Di1 to Di4, and first to eighth switch elements T1 to T8.

The first capacitor C1 may be connected between a first node n1 and a second node n2, and the second capacitor C2 may be connected between the second node n2 and a third node n3. A first power source Vdc1 may be applied between the first node n1 and the third node n3, and a value of the first power source Vdc1, which is a DC power source, may be maintained to be constant by the first and second capacitors C1 and C2. The first and third nodes n1 and n3 may constitute input ports of the first current charging circuit 111a.

The first to eighth switch elements T1 to T8 and ninth to sixteenth switch elements T9 to T16 may operate based on a control signal of the controller 120 (see FIG. 2) applied to each of their gate electrodes. The first to sixteenth switch elements T1 to T16 may be power semiconductor devices. Here, a power semiconductor device is used to convert or control power, and may be referred to as a power device. In FIG. 4, the first to sixteenth switch elements T1 to T16 are shown as power metal oxide semiconductor field effect transistors (MOSFETs), but are not limited thereto. For example, the first to sixteenth switch elements T1 to T16 may be insulated gate bipolar transistors (IGBTs).

A first electrode (for example, a drain) of the first switch element T1 may be connected to the first node n1, and a second electrode (for example, a source) of the first switch element T1 may be connected to a fourth node n4. A first electrode (for example, a drain) of the second switch element T2 may be connected to the fourth node n4, and a second electrode (for example, a source) of the second switch element T2 may be connected to a fifth node n5. A first electrode (for example, a drain) of the third switch element T3 may be connected to the fifth node n5, and a second electrode (for example, a source) of the third switch element T3 may be connected to a sixth node n6. A first electrode (for example, a drain) of the fourth switch element T4 may be connected to the sixth node n6, and a second electrode (for example, a source) of the fourth switch element T4 may be connected to the third node n3. A first electrode (for example, a drain) of the fifth switch element T5 may be connected to the first node n1, and a second electrode (for example, a source) of the fifth switch element T5 may be connected to a seventh node n7. A first electrode (for example, a drain) of the sixth switch element T6 may be connected to the seventh node n7, and a second electrode (for example, a source) of the sixth switch element T6 may be connected to an eighth node n8. A first electrode (for example, a drain) of the seventh switch element T7 may be connected to the eighth node n8, and a second electrode (for example, a source) of the seventh switch element T7 may be connected to a ninth node n9. A first electrode (for example, a drain) of the eighth switch element T8 may be connected to the ninth node n9, and a second electrode (for example, a source) of the eighth switch element T8 may be connected to the third node n3. The fifth and eighth nodes n5 and n8 may constitute output ports of the first current charging circuit 111a.

The first to fourth diodes Di1 to Di4 may be circuit elements for preventing a current of the first inductive element L1 from flowing backward. An anode of the first diode Di1 may be connected to the second node n2, and a cathode of the first diode Di1 may be connected to the fourth node n4. An anode of the second diode Di2 may be connected to the sixth node n6, and a cathode of the second diode Di2 may be connected to the second node n2. An anode of the third diode Di3 may be connected to the second node n2, and a cathode of the third diode Di3 may be connected to the seventh node n7. An anode of the fourth diode Di4 may be connected to the ninth node n9, and a cathode of the fourth diode Di4 may be connected to the second node n2.

The first inductive element L1 of the first current storage circuit 113a may include first and second inductors L1_1 and L1_2 that are inductively coupled to each other. A first terminal of the first inductive element L1_1 and a first terminal of the second inductor L1_2 may constitute the input ports of the first current storage circuit 113a. The first terminal of the first inductive element L1_1 may be connected to the fifth node n5, and the first terminal of the second inductor L1_2 may be connected to the eighth node n8. Accordingly, the first internal current IL1 stored in the first inductive element L1 may vary according to an output value of the first current charging circuit 111a.

A second terminal of the first inductive element L1_1 and a second terminal of the second inductor L1_2 may constitute the output ports of the first current storage circuit 113a. The second terminal of the first inductive element L1_1 may be connected to a tenth node n10, and the second terminal of the second inductor L1_2 may be connected to a twelfth node n12. The first internal current IL1 of the first inductive element L1 may be output to the first current discharging circuit 115a through the output port of the first current storage circuit 113a.

The first current discharging circuit 115a may include the ninth to twelfth switch elements T9 to T12 and fifth to eighth diodes Di5 to Di8. The tenth and twelfth nodes n10 and n12 may constitute input ports of the first current discharging circuit 115a, and eleventh and thirteen nodes n11 and n13 may constitute the output ports of the first current discharging circuit 115a.

A first electrode (for example, a drain) of the ninth switch element T9 may be connected to the tenth node n10, and a second electrode (for example, a source) of the ninth switch element T9 may be connected to an anode of the fifth diode Di5. A cathode of the fifth diode Di5 may be connected to the eleventh node n11.

A first electrode (for example, a drain) of the tenth switch element T10 may be connected to the eleventh node n11, and a second electrode (for example, a source) of the tenth switch element T10 may be connected to an anode of the sixth diode Di6. A cathode of the sixth diode Di6 may be connected to the twelfth node n12.

A first electrode (for example, a drain) of the eleventh switch element T11 may be connected to the tenth node n10, and a second electrode (for example, a source) of the eleventh switch element T11 may be connected to an anode of the seventh diode Di7. A cathode of the seventh diode Di7 may be connected to the thirteenth node n13.

A first electrode (for example, a drain) of the twelfth switch element T12 may be connected to the thirteenth node n13, and a second electrode (for example, a source) of the twelfth switch element T12 may be connected to an anode of the eighth diode Di8. A cathode of the eighth diode Di8 may be connected to the twelfth node n12.

A first electrode of the chamber CB may be connected to the eleventh node n11, and a second electrode of the chamber CB may be connected to the thirteenth node n13. Accordingly, the first output current IO1 of the first current discharging circuit 115a may be applied to the chamber CB.

The second current charging circuit 111b may include third and fourth capacitors C3 and C4, ninth and tenth diodes Di9 and Di10, and the thirteenth and fourteenth switch elements T13 and T14.

The third capacitor C3 may be connected between fourteenth and fifteenth nodes n14 and n15, and the fourth capacitor C4 is connected between the fifteenth node n15 and a sixteenth node n16. The second power source Vdc2 may be applied between the fourteenth and sixteenth nodes n14 and n16, and a value of the second power source Vdc2, which is a DC power source, may be maintained to be constant by the third and fourth capacitors C3 and C4. The fourteenth and sixteenth nodes n14 and n16 may constitute input ports of the second current charging circuit 111b.

A first electrode (for example, a drain) of the thirteenth switch element T13 may be connected to the fourteenth node n14, and a second electrode (for example, a source) of the thirteenth switch element T13 may be connected to a seventeenth node n17. A first electrode (for example, a drain) of the fourteenth switch element T14 may be connected to an eighteenth node n18, and a second electrode (for example, a source) of the fourteenth switch element T14 may be connected to the sixteenth node n16.

An anode of the ninth diode Di9 may be connected to the fifteenth node n15, and a cathode of the ninth diode Di9 may be connected to the seventeenth node n17. An anode of the tenth diode Di10 may be connected to the eighteenth node n18, and a cathode of the tenth diode Di10 may be connected to the fifteenth node n15. The seventeenth and eighteenth nodes may constitute output ports of the second current charging circuit 111b. In FIG. 4, it is shown that the second current charging circuit 111b has a simple circuit configuration compared to the first current charging circuit 111a, but the inventive concept is not limited thereto. According to example embodiments, the second current charging circuit 111b may be configured as substantially the same circuit as the first current charging circuit 111a.

The second inductive element L2 of the second current storage circuit 113b may include first and second inductors L2_1 and L2_2 inductively coupled to each other. A first terminal of the first inductor L2_1 and a first terminal of the second inductor L2_2 may constitute input ports of the second current storage circuit 113b. The first terminal of the first inductor L2_1 may be connected to the seventeenth node n17, and the first terminal of the second inductor L2_2 may be connected to the eighteenth node n18. Accordingly, the second internal current IL2 stored in the second inductive element L2 may vary according to an output value of the second current charging circuit 111b.

A second terminal of the first inductor L2_1 and a second terminal of the second inductor L2_2 may constitute output ports of the second current storage circuit 113b. The second terminal of the first inductor L2_1 may be connected to the thirteenth node n13, and the second terminal of the second inductor L2_2 may be connected to a nineteenth node n19. The second internal current IL2 of the second inductive element L2 may be output to the second current discharging circuit 115b through the output port of the second current storage circuit 113b.

The second current discharging circuit 115b may include the fifteenth and sixteenth switch elements T15 and T16 and eleventh and twelfth diodes Di11 and Di12. The seventeenth and eighteenth nodes n17 and n18 may constitute input ports of the second current discharging circuit 115b, and the eleventh and thirteenth nodes n11 and n13 may constitute output ports of the second current discharging circuit 115b. The second current discharging circuit 115b may output the second internal current IL2 input through its input port, to its output port, or may provide a path through which the second internal current IL2 may freewheel. According to example embodiments, the second current discharging circuit 115b may be a two-level pulse current source.

The first and second current discharging circuits 115a and 115b may be two-port networks in which the output ports are connected to each other in parallel. The first and second current discharging circuits 115a and 115b may be terminated two-port networks in which the chamber CB is connected to the output ports.

A first electrode (for example, a drain) of the fifteenth switch element T15 may be connected to the thirteenth node n13, and a second electrode (for example, a source) of the fifteenth switch element T15 may be connected to an anode of the eleventh diode Di11. A cathode of the eleventh diode Di11 may be connected to the nineteenth node n19.

A first electrode (for example, a drain) of the sixteenth switch element T16 may be connected to the eleventh node n11, and a second electrode (for example, a source) of the sixteenth switch element T16 may be connected to an anode of the twelfth diode Di12. A cathode of the twelfth diode Di12 may be connected to the nineteenth node n19.

As illustrated in FIG. 4, a parasitic inductor Ls may be formed in the pulse circuit 110a, and thus, a ringing phenomenon in which a voltage oscillates due to LC resonance may occur in a voltage waveform generator including a related art capacitor-based converting circuit. Here, the parasitic inductor Ls is an unintended equivalent inductor formed by the components constituting the pulse circuit 110a, and is not a Intentionally provided element. A bias voltage that accelerates plasma ions in a related art chamber varies over time due to the ringing phenomenon, and thus, the energy of ions reaching a wafer is distributed over a wide energy band. According to an example embodiment, a capacitor may be not arranged in the pulse circuit 110a, and the inductive element L1 may include an inductance much greater (for example, about 10 times or greater or about 100 times or greater) than that of the parasitic inductor Ls, and accordingly the oscillation of the output voltage VOUT applied to the chamber CB may not occur. Accordingly, the reliability of the voltage generator 110 may be improved.

Figure 5:
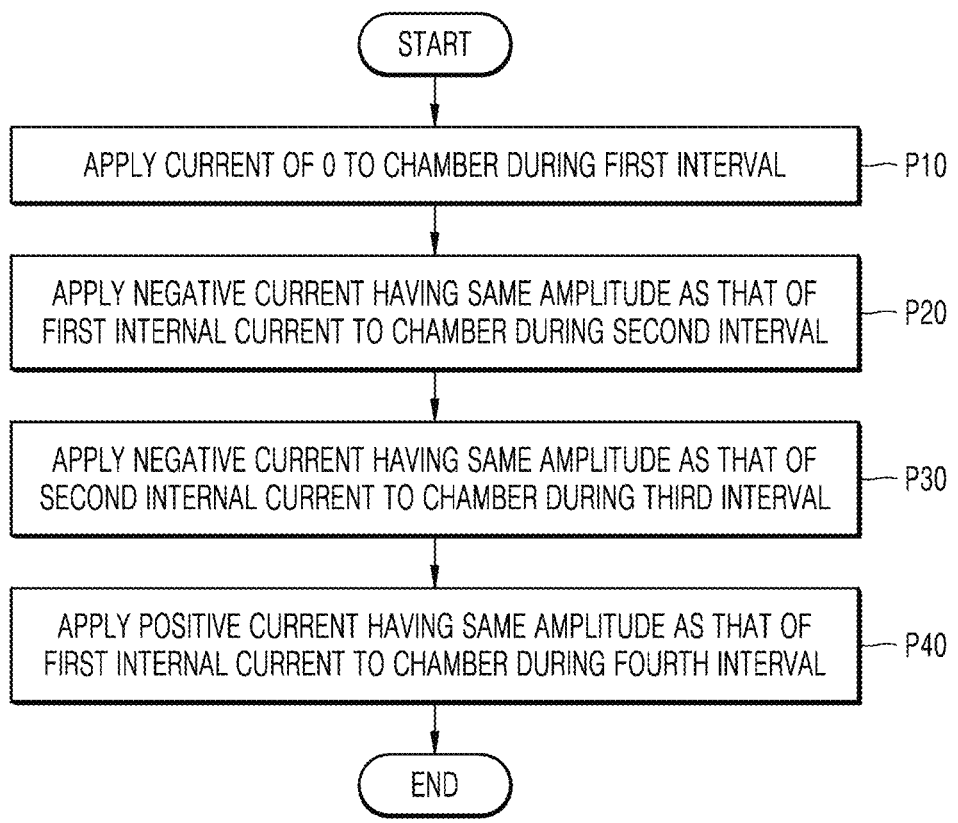
FIG. 5 is a flowchart for explaining a method of generating a voltage waveform using a voltage generator according to an example embodiment.

FIG. 5 is a flowchart of a method of generating a waveform of the output voltage VOUT using the voltage generator 110 according to according to an example embodiment. FIG. 6 is a graph illustrating a change in the output voltage VOUT and the chamber current ICB applied to the chamber CB in the voltage generator 110, in accordance with time. FIGS. 7A to 7D are circuit diagrams for explaining an operation of the voltage generator 110 of FIG. 2.

Figure 7A:
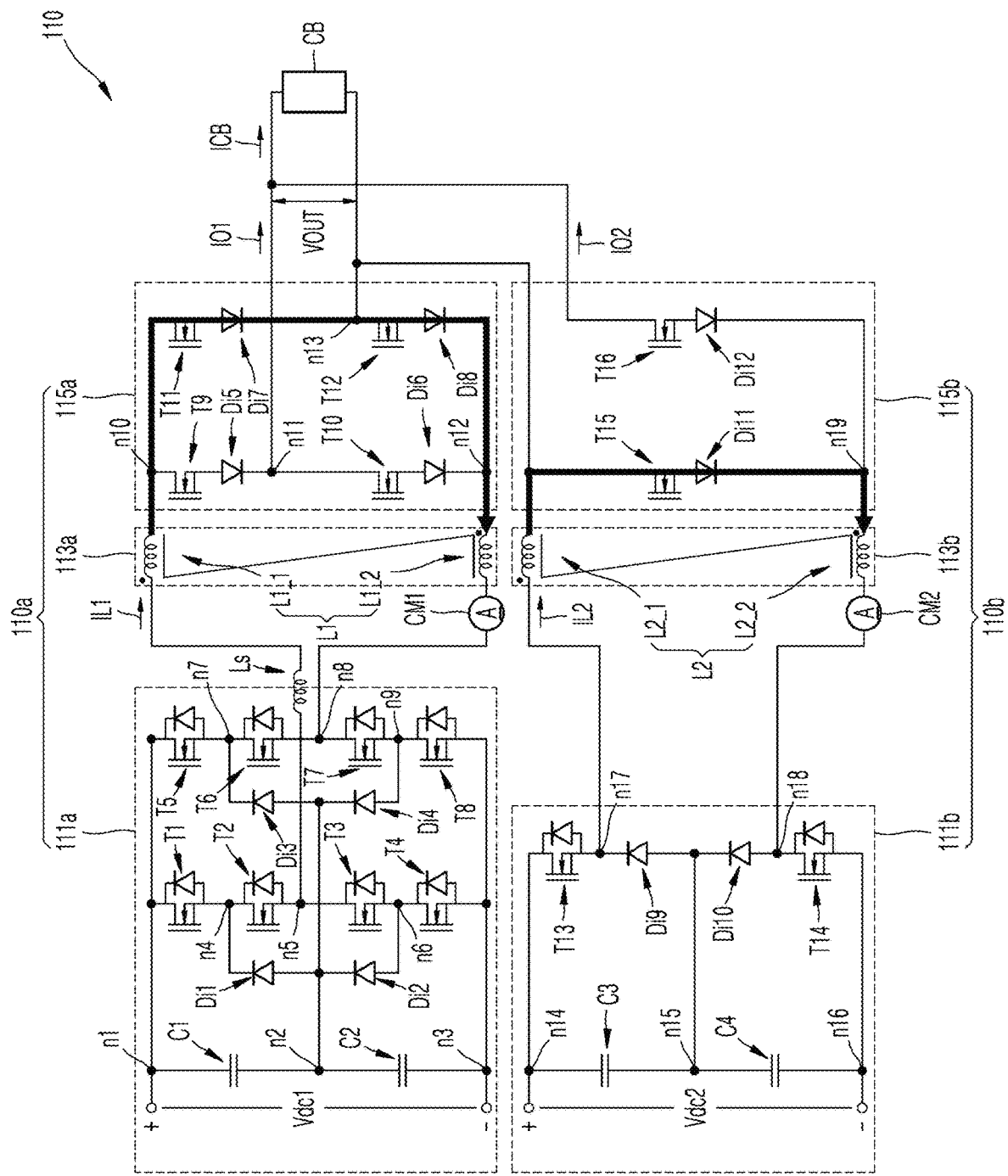
FIGS. 7A to 7D are circuit diagrams for explaining an operation of the voltage generator of FIG. 2.
Figure 7B:
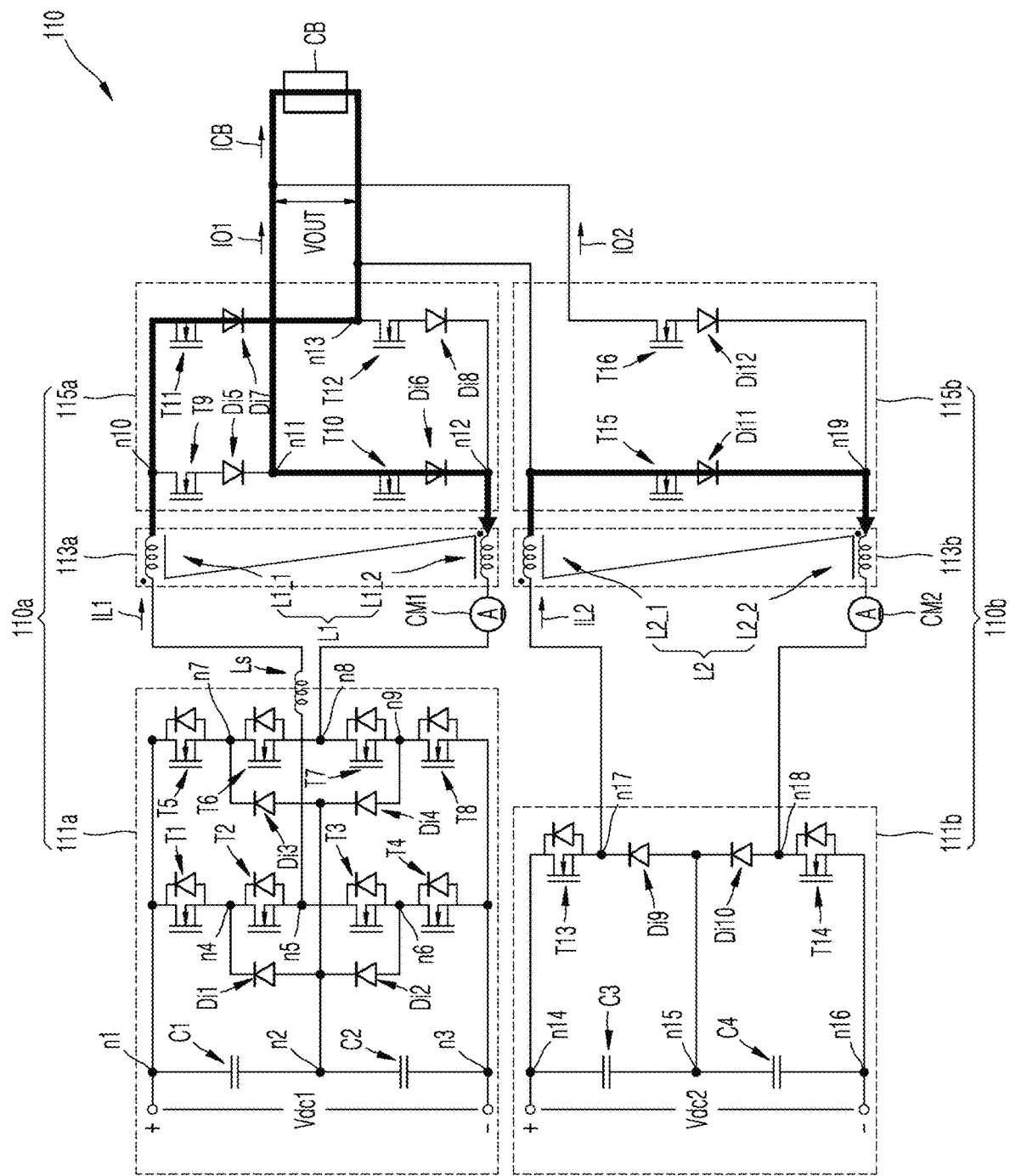
Figure 7C:
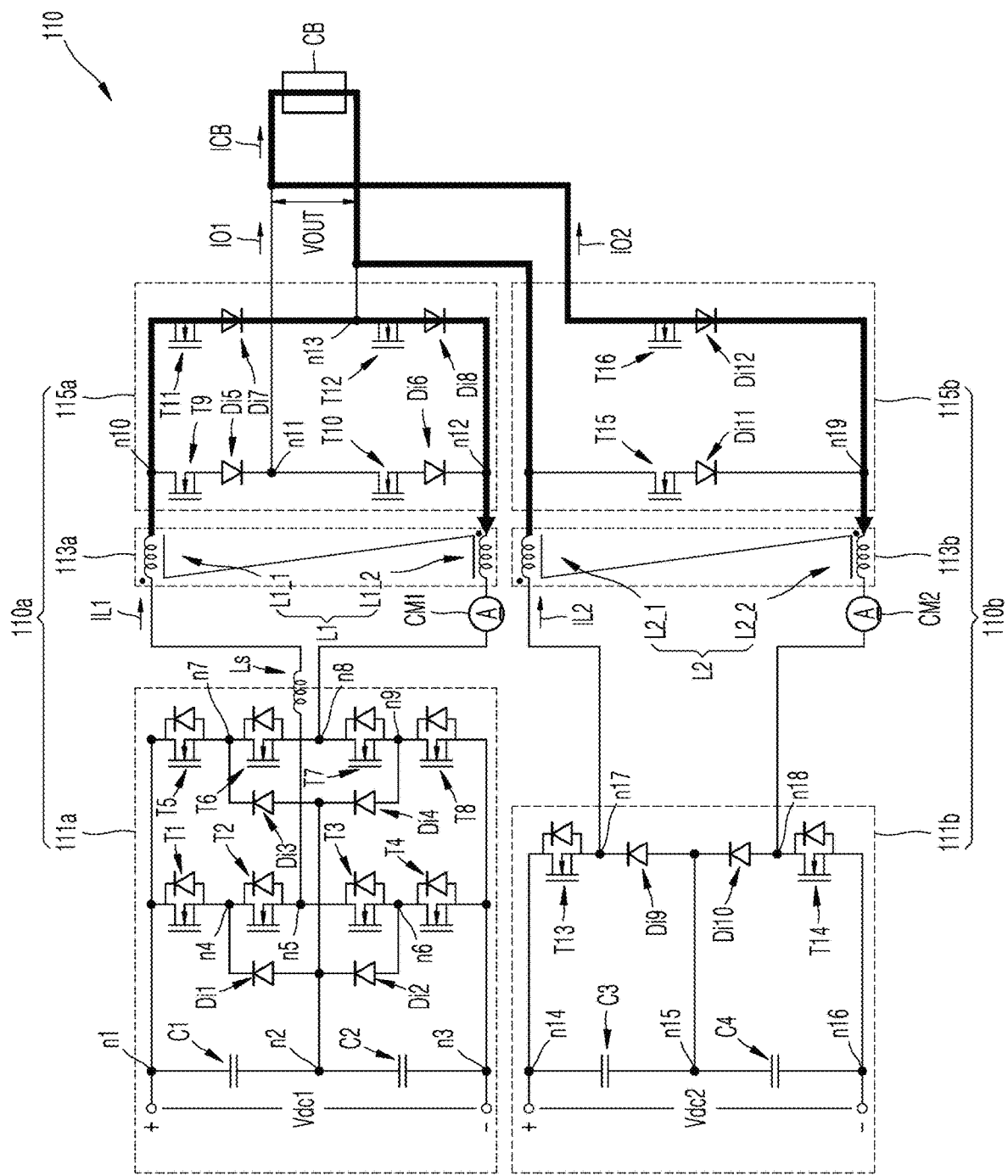
Figure 7D:
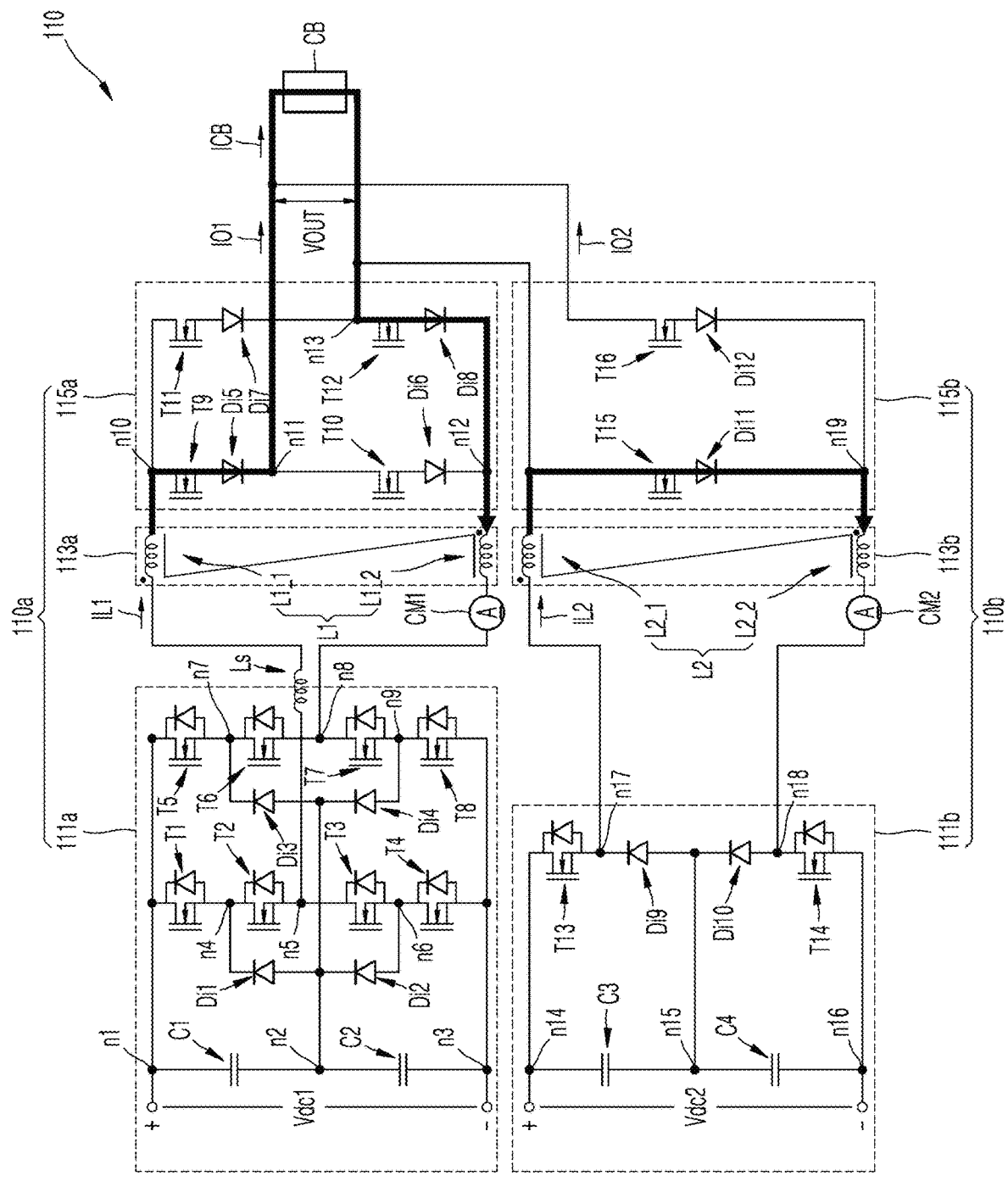

Referring to FIGS. 6 and 7A, the voltage generator 110 may apply a voltage waveform having a period T to the chamber CB. The period T may include first to fourth intervals D1, D2, D3, and D4. The first interval D1 may be an off-duty, and the second to fourth intervals D2 to D4 may be on-duties.

Referring to FIGS. 1, 5, 6, and 7A, in operation P10 the voltage generator 110 may apply a zero current (0A) during the first interval D1. The controller 120 may turn on the eleventh, twelfth, and fifteenth switch elements T11, T12, and T15 and turn off the ninth, tenth, and sixteenth switch elements T9, T10, and T16. Accordingly, the first and second internal currents IL1 and IL2 may flow along a path including portions indicated by bold lines in FIG. 7A. Accordingly, the values of the first and second output currents IO1 and IO2 may be 0 A, respectively, and the chamber current ICB, a current flowing into the chamber, may also be 0 A.

Referring to FIGS. 1, 5, 6, and 7B, in operation P20, the voltage generator 110 may apply a negative current having the same amplitude as the first internal current IL1 to the chamber CB during the second interval D2. The controller 120 may turn on the tenth, eleventh, and fifteenth switch elements T10, T11, and T15 and turn off the ninth, twelfth, and sixteenth switch elements T9, T12, and T16. Accordingly, the first and second internal currents IL1 and IL2 may flow along a path including portions indicated by bold lines.

Accordingly, the first internal current IL1 may be output as the first output current IO1 having a negative value. The second internal current IL2 may freewheel along a closed loop including the fifteenth switch element T15 and the eleventh diode Di11, and the second output current IO2 may be 0 A. That is, the first output current IO1 may be a negative current having the same amplitude as the first internal current ILL and the chamber current ICB may be the same as the first output current IO1.

The output voltage VOUT applied to the chamber CB may drop from a first voltage V1, which is a positive voltage, to a second voltage V2, which is a negative voltage, during the second interval D2. A difference between the first voltage and the second voltage may be about 1 kV or greater, but is not limited thereto. According to an example embodiment, an amplitude of the first voltage V1 may be equal to an amplitude of the second voltage V2, but is not limited thereto. According to an example embodiment, the second interval D2 may be in a range of about $1/100$ to about $1/2$ of the period T. According to an example embodiment, the second interval D2 may be in a range of about $1/10$ to about $4/5$ of the period T.

Referring to FIGS. 1, 5, 6, and 7C, in operation P30, the voltage waveform generator 100 may apply a negative current having the same amplitude as that of the second internal current IL2 to the chamber CB during the third interval D3. The controller 120 may turn on the eleventh, twelfth, and sixteenth switch elements T11, T12, and T16 and turn off the ninth, tenth, and fifteenth switch elements T9, T10, and T15. Accordingly, the first and second internal currents IL1 and IL2 may flow along a path including portions indicated by bold lines.

Accordingly, the first internal current IL1 may freewheel along a closed loop including the eleventh and twelfth switch elements T11 and T12, and the first output current IO1 may be 0 A. The second internal current IL2 may be output as the second output current IO2 having a negative value through the sixteenth switch element T16 and the twelfth diode Di12. That is, the second output current IO2 may be a negative current having the same amplitude as that of the second internal current IL2, and the chamber current ICB may be the same as the second output current IO2. The output voltage VOUT applied to the chamber CB may drop from the second voltage V2 to a third voltage V3, which is a lower negative voltage. A difference between the second voltage V2 and the third voltage V3 may be about hundreds of volts, but is not limited thereto. The third interval D3 may be in a range of about $1/10$ to about $9/10$ of the period T, but is not limited thereto.

Referring to FIGS. 1, 5, 6, and 7D, in operation P40, the voltage waveform generator 100 may apply a positive current having the same amplitude as that of the first internal current IL1 to the chamber CB during the fourth interval D4. The controller 120 may turn on the ninth, twelfth, and fifteenth switch elements T9, T12, and T15 and turn off the tenth, eleventh, and sixteenth switch elements T10, T11, and T16. Accordingly, the first and second internal currents IL1 and IL2 may flow along a path including portions indicated by bold lines.

Accordingly, the first internal current IL1 may be output as the first output current IO1 along a closed loop including the ninth and twelfth switch elements T9 and T12. The second internal current IL2 may freewheel along the closed loop including the fifteenth switch element T15 and the eleventh diode Di11, and the second output current IO2 may be 0 A. That is, the first output current IO1 may be a positive current having the same amplitude as that of the first internal current ILL and the chamber current ICB may be the same as the first output current IO1.

The output voltage VOUT applied to the chamber CB may increase from the third voltage V3 to the first voltage V1, which is an initial voltage within the period T. According to example embodiments, the fourth interval D4 may be greater than the second interval D2, but is not limited thereto.

Figure 8:
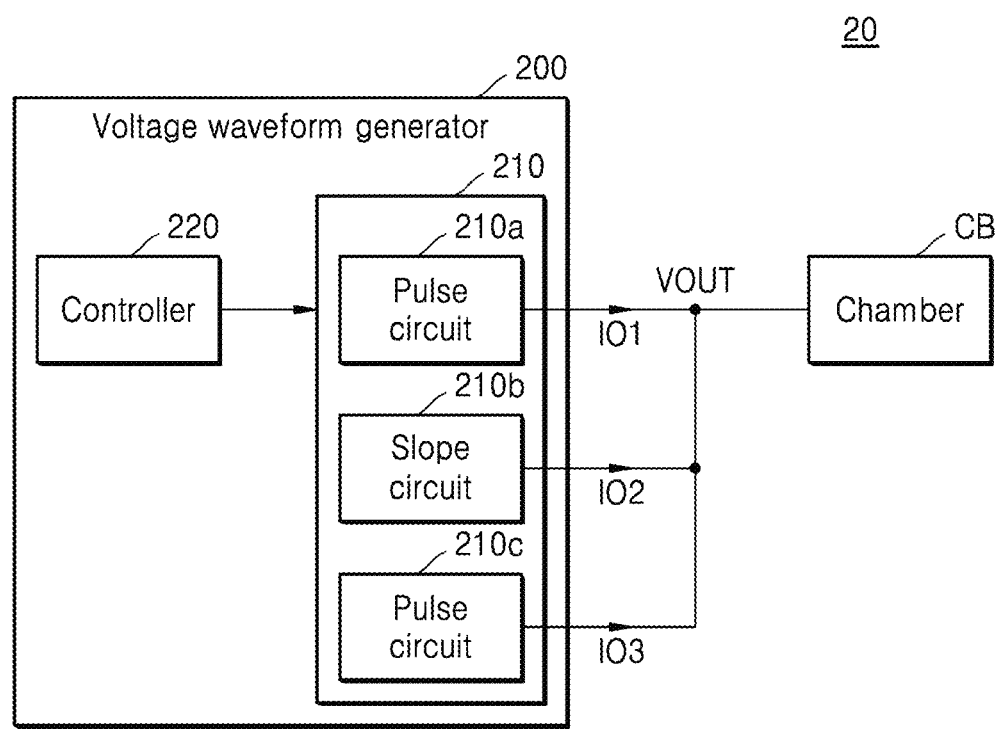
FIGS. 8 and 9 are block diagrams schematically illustrating a plasma processing apparatus according to an example embodiment.

FIG. 8 is a block diagram schematically illustrating a plasma processing apparatus 20 according to an example embodiment.

For convenience of explanation, the same descriptions as those described with reference to FIGS. 1, 2, 4, and 7A to 7D will be omitted and differences will be mainly described.

Referring to FIG. 8, the plasma processing apparatus 20 may include a voltage waveform generator 200 and the chamber CB. The voltage waveform generator 200 may generate the output voltage VOUT having a waveform set by a user, and may provide the generated output voltage VOUT to the chamber CB.

The voltage waveform generator 200 may include a voltage generator 210 and a controller 220. The controller 220 is similar to the controller 120 described with reference to FIG. 1.

Unlike the voltage generator 110 of FIG. 1, the voltage generator 210 may include first and second pulse circuits 210a and 210c and a slope circuit 210b. Each of the first and second pulse circuits 210a and 210c may have a configuration similar to, and operate in a manner similar to those of the pulse circuit 110a of FIG. 1. The slope circuit 210b is similar to the slope circuit 110b of FIG. 1.

According to an example embodiment, the first and second pulse circuits 210a and 210c may output the first output current IO1 and a third output current IO3 having different amplitudes, and as such, the first and second pulse circuits 210a and 210c may apply the output voltage VOUT having different pulse shapes to the chamber CB. Accordingly, the output voltage VOUT applied to the chamber CB may stably apply different voltages according to process conditions. For example, the first pulse circuit 210a may output the first output current IO1 that is not zero (i.e., not 0A) under a first process condition, and the second pulse circuit 210c may output the third output current IO3 that is not zero (i.e., not 0A) under a second process condition.

According to an example embodiment, the first pulse circuit 210a and the second pulse circuit 210c may alternately output the first and third output currents IO1 and IO3. For example, in the graph of FIG. 6, the first pulse circuit 210a may apply the first output current IO1, which is not 0, to the chamber CB during the second and fourth intervals D2 and D4 of any one period T, and the second pulse circuit 210c may apply the third output current IO3, which is not 0, to the chamber CB during the second and fourth intervals D2 and D4 of a subsequent period T.

According to an example embodiment, during the second interval D2 within one period T of FIG. 6, the first pulse circuit 210a may apply the first output current IO1, which is not zero (i.e., not 0A), to the chamber CB, and during the fourth interval D4, the second pulse circuit 210c may apply the third output current IO3, which is not zero (i.e., not 0A), to the chamber CB.

According to an example embodiment, the first and second pulse circuits 210a and 210c may output the first and third output currents IO1 and IO3 having substantially the same amplitude. In this case, the second pulse circuit 210c may be a preliminary circuit of the first pulse circuit 210a.

Figure 9:
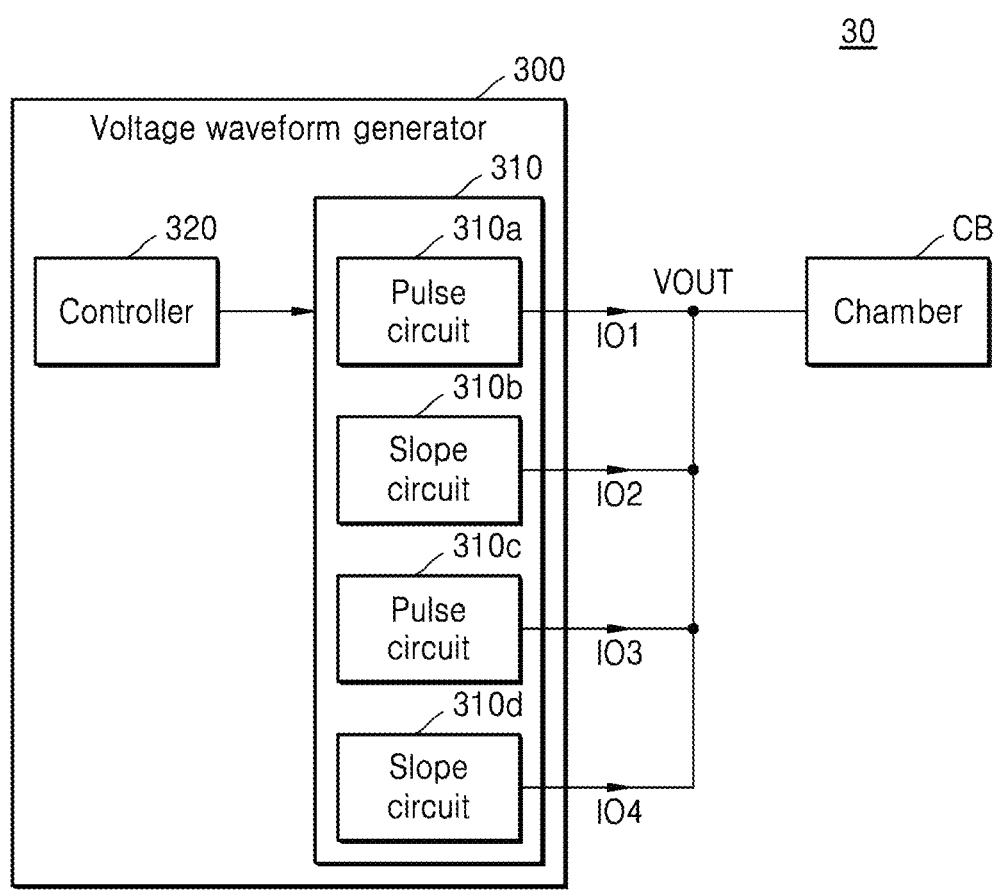

FIG. 9 is a block diagram schematically illustrating a plasma processing apparatus 30 according to some embodiments.

Referring to FIG. 9, the plasma processing apparatus 30 may include a voltage waveform generator 300 and the chamber CB. The voltage waveform generator 300 may generate the output voltage VOUT having a waveform set by a user, and may provide the generated output voltage VOUT to the chamber CB.

The voltage waveform generator 300 may include a voltage generator 310 and a controller 320. The controller 320 is similar to the controller 120 described with reference to FIG. 1.

Unlike the voltage generator 110 of FIG. 1, the voltage generator 310 may include first and second pulse circuits 310a and 310c and first and second slope circuits 310b and 310d. Each of the first and second pulse circuits 310a and 310c may have a configuration similar to, and operate in a manner similar to those of the pulse circuit 110a of FIG. 1. The first and second slope circuits 310b and 310d may have a configuration similar to, and operate in a manner similar to those of the slope circuit 110b of FIG. 1.

According to an example embodiment, the first and second pulse circuits 310a and 310c may output the first and third output currents IO1 and IO3 having different amplitudes to apply the output voltage VOUT having different pulse shapes to the chamber CB. According to an example embodiment, the first and second pulse circuits 310a and 310c may output the second output current IO2 and a fourth output current IO4 having different amplitudes to generate slopes having different shapes in an on-duty of a pulse of the output voltage VOUT.

Accordingly, the voltage waveform generator 300 may apply the output voltage VOUT in a stable manner, to the chamber CB by a combination of the first to fourth output currents IO1 to IO4. The voltage VOUT is a pulse voltage having a waveform according to process conditions.

Figure 10A:
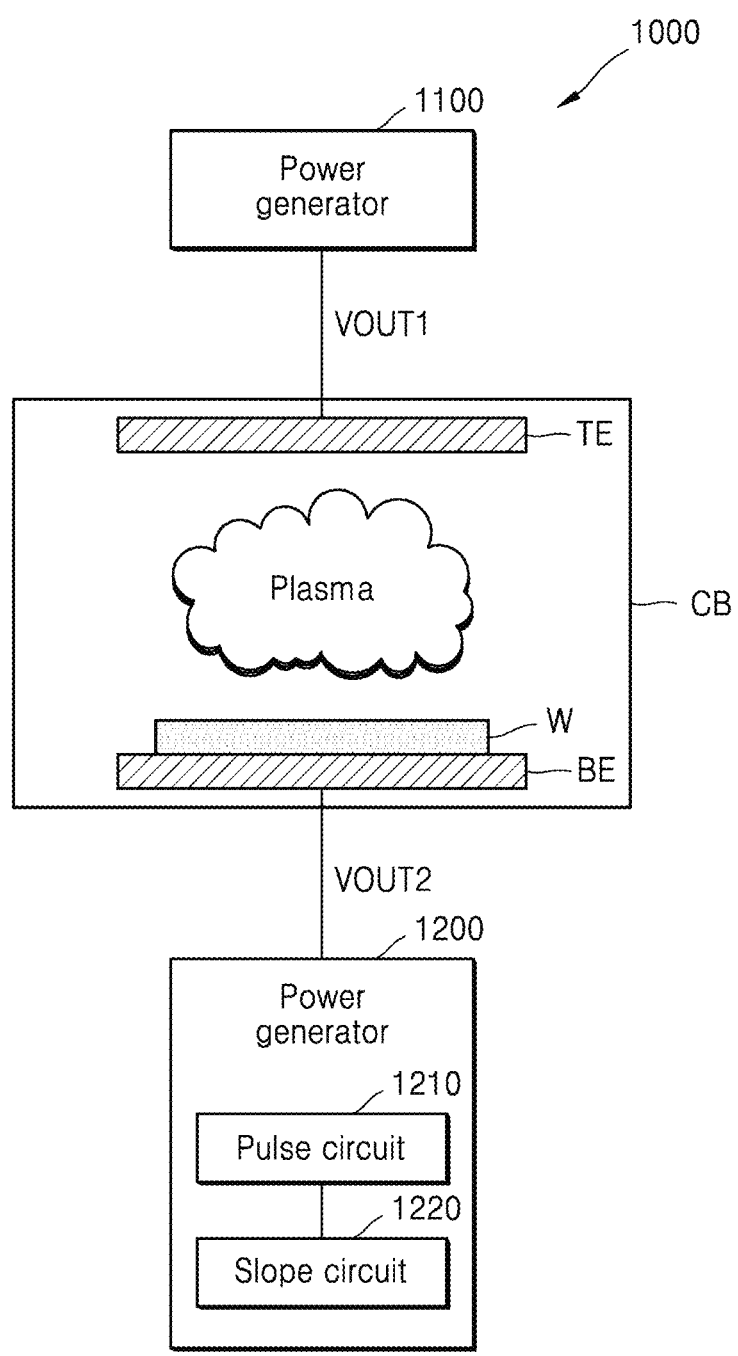
FIG. 10A is a block diagram for explaining a wafer processing apparatus according to an example embodiment.

FIG. 10A is a block diagram for explaining a wafer processing apparatus 1000 according to an example embodiment.

Figure 10B:
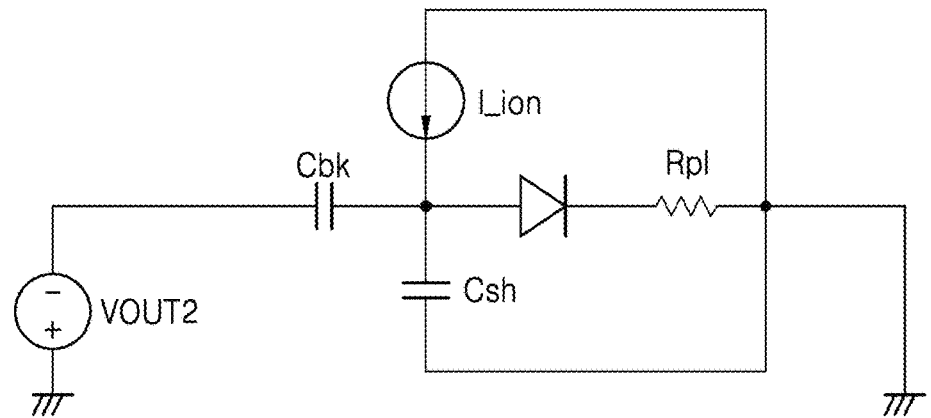
FIG. 10B is a circuit diagram of a result of modelling a wafer processing apparatus according to an example embodiment.

FIG. 10B is a circuit diagram of a result of modelling the wafer processing apparatus 1000 according to an example embodiment.

Referring to FIGS. 10A and 10B, the wafer processing apparatus 1000 may include the chamber CB, a first power generator 1100, and a second power generator 1200. A top electrode TE may be at an upper portion of the chamber CB, a bottom electrode BE may be at a lower portion of the chamber CB, and a wafer W may be on the bottom electrode BE. According to an example embodiment, the bottom electrode BE may include an electrostatic chuck (ESC) that fixes and supports the wafer W using an electrostatic force. In addition, the chamber CB may include a gas supplier and a gas exhauster, and the gas supplier may supply a reaction gas into the chamber CB and the chamber CB may be maintained to be in a vacuum state by discharging the gas through the gate exhauster.

The wafer processing apparatus 1000 in FIG. 10A is illustrated, for convenience of explanation, as a radical controlled plasma chamber in which a continuous wave RF power source is applied to the top electrode TE and a bias voltage is applied to the bottom electrode BE. However, the technical spirit of the inventive concept is not limited to the radical controlled plasma chamber, and as such, according to other example embodiments, other forms of chambers may be used. For example, the wafer processing apparatus 1000 may be a capacitively coupled plasma chamber in which a ground potential is applied to the top electrode and a continuous wave RF power source and a bias power source are applied to the bottom electrode, respectively.

The first power generator 1100 may generate a first output voltage VOUT1 and may provide the generated first output voltage VOUT1 to the top electrode TE. The first output voltage VOUT1 is power for generating plasma and may be referred to as source power. According to some embodiments, the first output voltage VOUT1 may be a radio frequency (RF) sinusoidal voltage, and the first power generator 1100 may be an RF power generator. However, the inventive concept is not limited thereto, and the first power generator 1100 may be implemented as the voltage waveform generators 100, 200, and 300 of FIGS. 1, 8, and 9, and may provide the first output voltage VOUT1 of a non-sinusoidal wave.

The second power generator 1200 may generate a second output voltage VOUT2 and may provide the generated second output voltage VOUT2 to the bottom electrode BE. The second output voltage VOUT2 is power for controlling ion energy of plasma, and may be a bias voltage. When second power is applied to the bottom electrode BE, a voltage may be induced in the wafer W, which is on the bottom electrode BE. Accordingly, the voltage of the wafer W may be controlled by the second power, and thus, ion energy of plasma generated in the chamber CB may be controlled.

As illustrated in FIG. 10B, the bottom electrode BE may be modeled as a blocking capacitor Cbk, the second power generator 1200 may be modeled as a voltage source, the plasma may be modeled as a resistance Rpl, and a movement of a + ion included in the plasma may be modeled as a constant current source I_ion. A sheath, which is a space between the plasma and the bottom electrode BE, may be modeled as a sheath capacitor Csh, and thus, the chamber CB may be a capacitive load. The voltage of the wafer W is represented by a wafer voltage Vwaf. A diode of FIG. 10B is for indicating an orientation of movements of ions.

According to an example embodiment, the second power generator 1200 may output a high-voltage, high-frequency voltage waveform set by a user. For example, the second power generator 1200 may output a certain voltage waveform having a frequency of several kHz to several MHz and has a voltage level of several tens of V to several tens of kV. The second power generator 1200 may be implemented using the voltage waveform generators 100, 200, and 300 of FIGS. 1, 8, and 9, and the description given above with reference to FIGS. 1 to 9 may be applied to the second power generator 1200.

In detail, the second power generator 1200 may include at least one pulse circuit 1210 and at least one slope circuit 1220, and the at least one pulse circuit 1210 and the at least one slope circuit 1220 may be configured in any one of the schemes illustrated in FIGS. 1, 8, and 9. The at least one pulse circuit 1210 may generate a square wave, and the at least one slope circuit 1220 may generate a slope in an on-duty of the square wave.

The distribution of the ion energy may be determined according to a slope voltage waveform output from the slope circuit 1220. In more detail, as ions of plasma reach the wafer W, the wafer voltage Vwaf may increase, and the slope circuit 1220 may cancel the increase of the wafer voltage Vwaf due to the arrival of the ions. Accordingly, the second power generator 1200 may allow plasma ions of the second output voltage VOUT2 to be distributed over a narrow energy area.

According to an example embodiment, the wafer processing apparatus 1000 may further include a filter between the second power generator 1200 and the bottom electrode BE. The filter may block the first output voltage VOUT1 to prevent the first output voltage VOUT1 generated by the first power generator 1100 from being applied to the second power generator 1200, and may pass the second power to allow the second output voltage VOUT2 generated by the second power generator 1200 to be applied to the bottom electrode BE. In detail, the filter may remove a frequency component of RF power generated by the first power generator 1100. For example, the filter may include a low pass filter, a band stop filter, or a combination thereof.

According to an example embodiment, the wafer processing apparatus 1000 may further include a filter between the first power generator 1100 and the top electrode TE. The filter may block the second output voltage VOUT2 to prevent the second output voltage VOUT2 generated by the second power generator 1200 from being applied to the first power generator 1100, and may pass the first output voltage VOUT1 generated by the first power generator 1100 to allow the first output voltage VOUT1 to be applied to the top electrode TE. For example, the filter may include a high pass filter, a band stop filter, or a combination thereof.

The reaction gas may be dispersed in the chamber CB and converted into plasma by the first output voltage VOUT1 applied through the top electrode TE. The plasma may contact a surface of the wafer W to physically and chemically react with the wafer W, and a wafer processing process, such as a plasma annealing process, an etching process, a plasma-enhanced chemical vapor deposition process, a physical vapor deposition process, or a plasma cleaning process, may be performed through the physical and chemical reaction.

For example, in the case where the wafer processing apparatus 1000 is used in the etching process, the reaction gas may become plasma due to a high frequency discharge between the bottom electrode BE and the top electrode TE, and a processed layer on the wafer W may be etched into a desired pattern by radicals, electrons, and ions activated by the plasma. According to the present embodiment, etching performance such as an etching rate, an aspect ratio, a critical dimension of the etching pattern, a profile of the etching pattern, and a selectivity may be improved by precisely controlling energy distribution of each of radicals, electrons, and ions of the plasma.

Figure 11A:
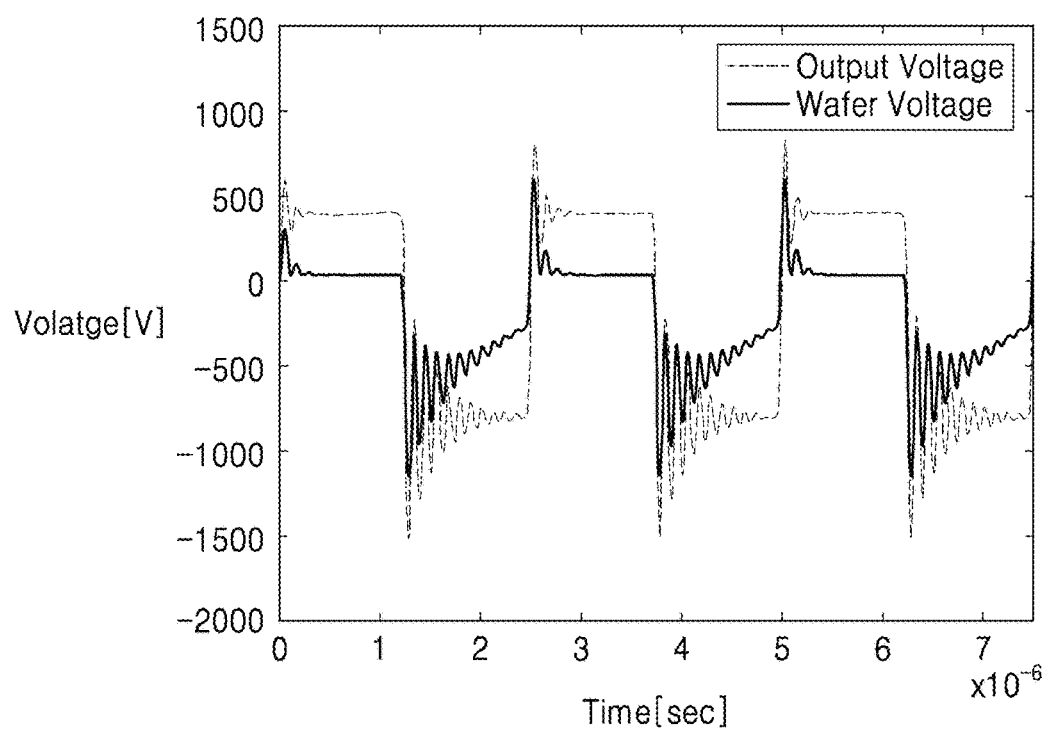
FIGS. 11A to 11C are diagrams for explaining concerns of related art plasma processing apparatuses.
Figure 11B:
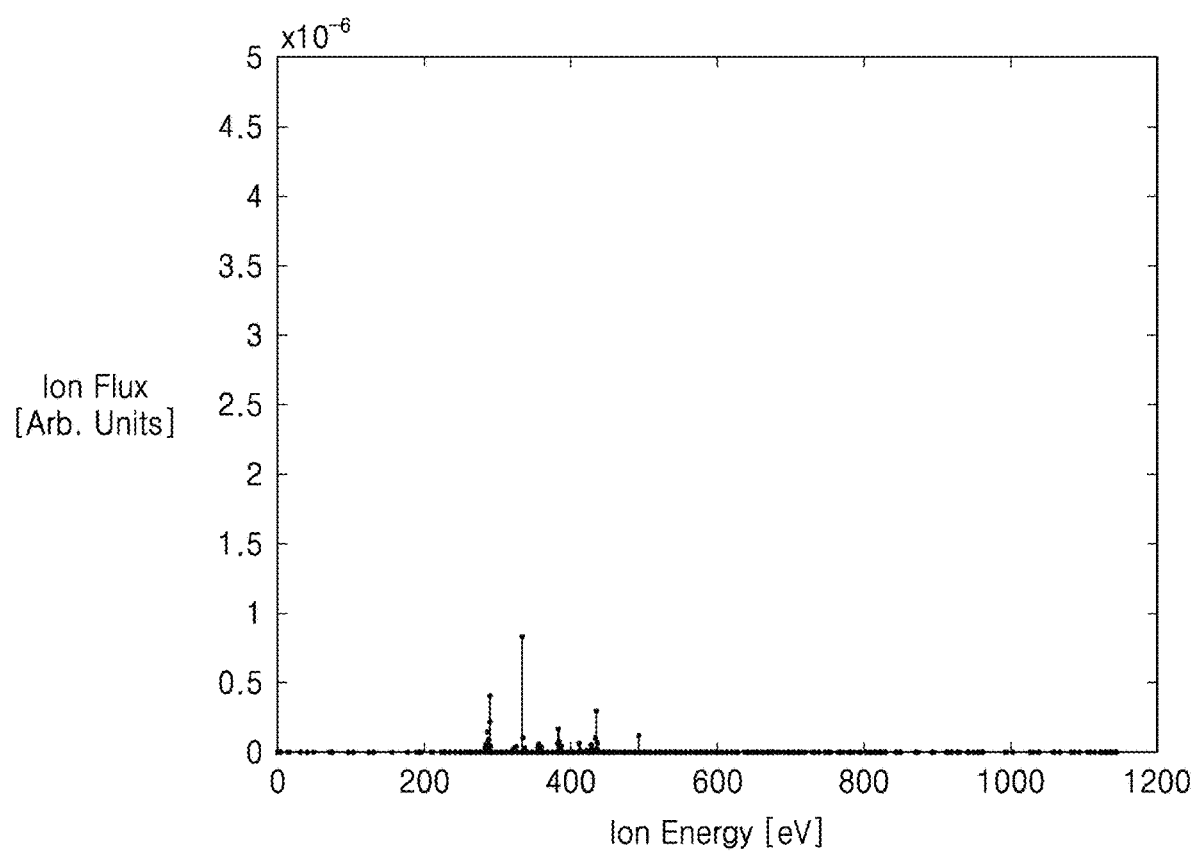
Figure 11C:
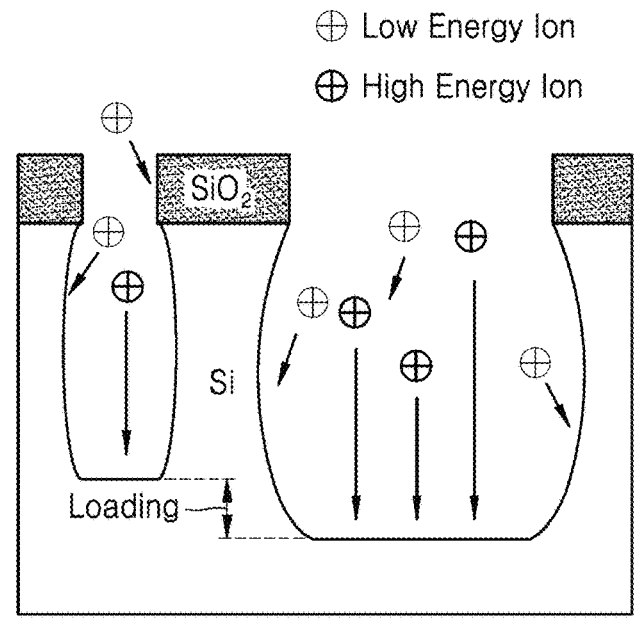
Figure 12A:
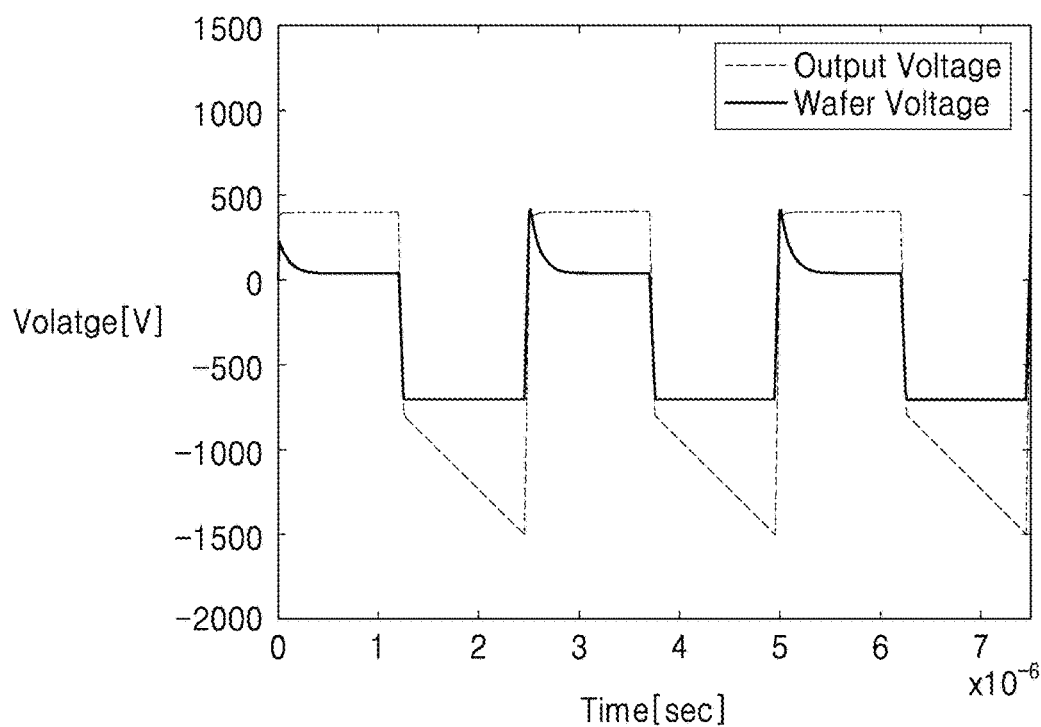
FIGS. 12A to 12C are diagrams for explaining the effects of a plasma processing apparatus according to an example embodiment.
Figure 12B:
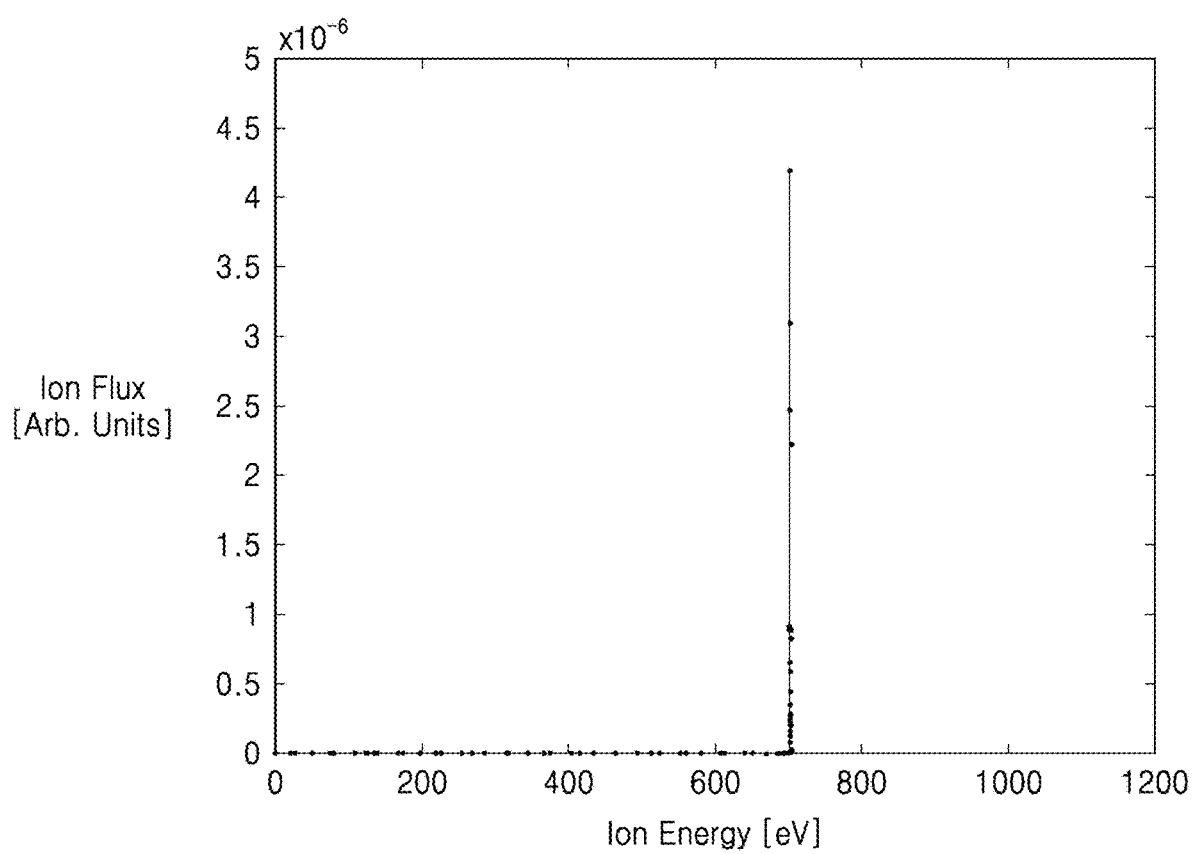
Figure 12C:
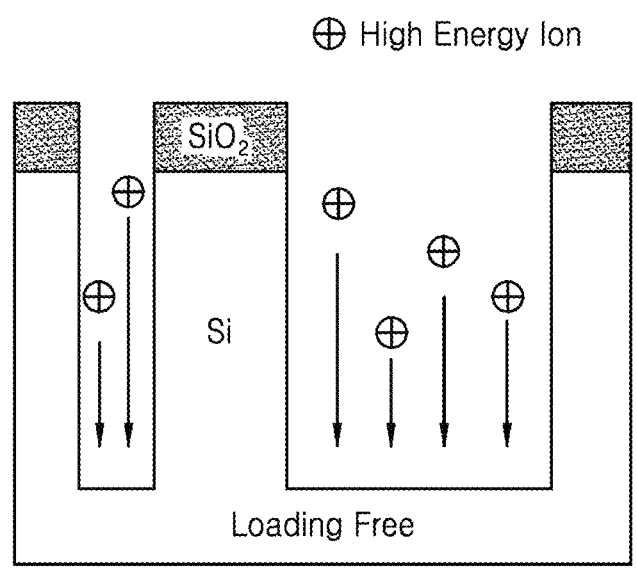

FIGS. 11A to 11C are diagrams for explaining concerns of a related art plasma processing apparatus, and FIGS. 12A to 12C are diagrams for explaining the effects of a plasma processing apparatus according to one or more example embodiments.

Referring to FIG. 11A, there is shown an output voltage of a related art power generator corresponding to the second power generator 1200 of FIG. 10A and a voltage of a wafer applied to the wafer by a related art power generator.

The related art power generator uses a capacitor-based voltage converter that outputs a voltage stored in an internal capacitor. In the related art power generator, an output voltage of the power generator oscillates due to resonance between a parasitic inductance formed in the power generator and a voltage storage capacitor. Due to the resonance, the voltage applied to the wafer also oscillates in accordance with time, and thus ion energy is distributed over a wide band as shown in FIG. 11B. Ions having relatively low energy may have a low linearity and a short moving distance, and as a result, as shown in FIG. 11C, a bowing phenomenon in which sidewalls of openings formed by plasma etching are excessively etched, and a loading phenomenon in which etching depths of the openings having different widths vary may occur.

Referring to FIGS. 10A and 12A, the second power generator 1200 according to one or more example embodiments may include a current-type converter based on an inductor element, and thus, the parasitic inductance may be substantially ignored. Accordingly, oscillation due to resonance may not be generated in the output voltage of the second power generator 1200, and the voltage of the wafer W may be maintained to be relatively constant. Therefore, as shown in FIG. 12B, the ion energy may be distributed in a significantly narrow band, and thus, the bowing phenomenon and the loading phenomenon may not occur and the etching profiles of the openings may be improved as shown in FIG. 12C.

Figure 13:
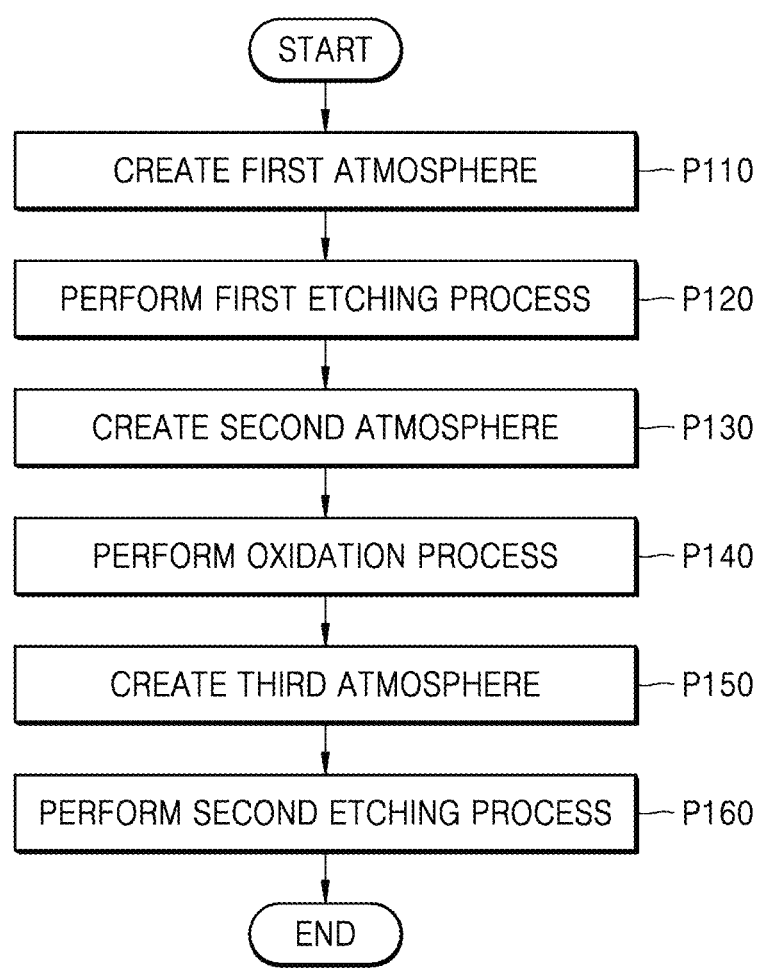
FIG. 13 is a flowchart of a method of fabricating a semiconductor device according to an example embodiment.

FIG. 13 is a flowchart of a method of fabricating a semiconductor device according to some embodiments.

Figure 14:
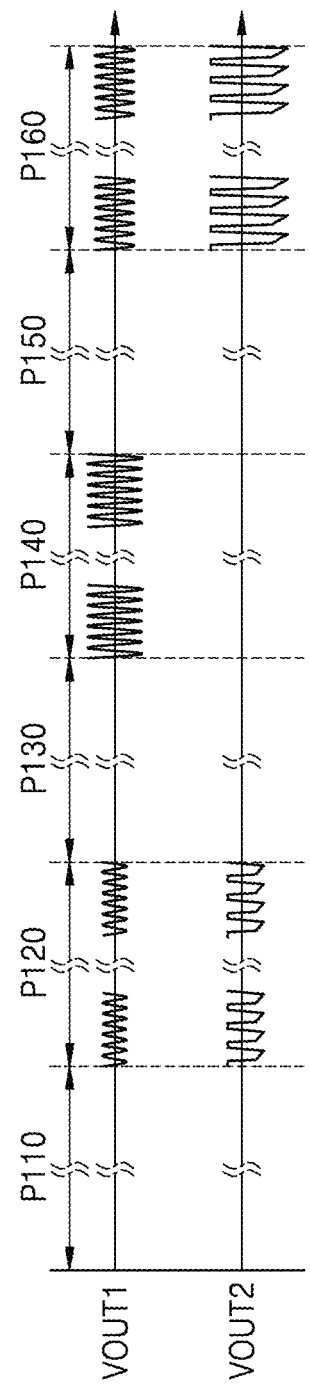
FIG. 14 is a graph for explaining a method of fabricating a semiconductor device according to an example embodiment.

FIG. 14 is a graph for explaining a method of fabricating a semiconductor device according to some embodiments. In more detail, FIG. 14 shows changes in the first and second output voltages VOUT1 and VOUT2 of FIG. 10A, for each process of FIG. 13.

Figure 15A:
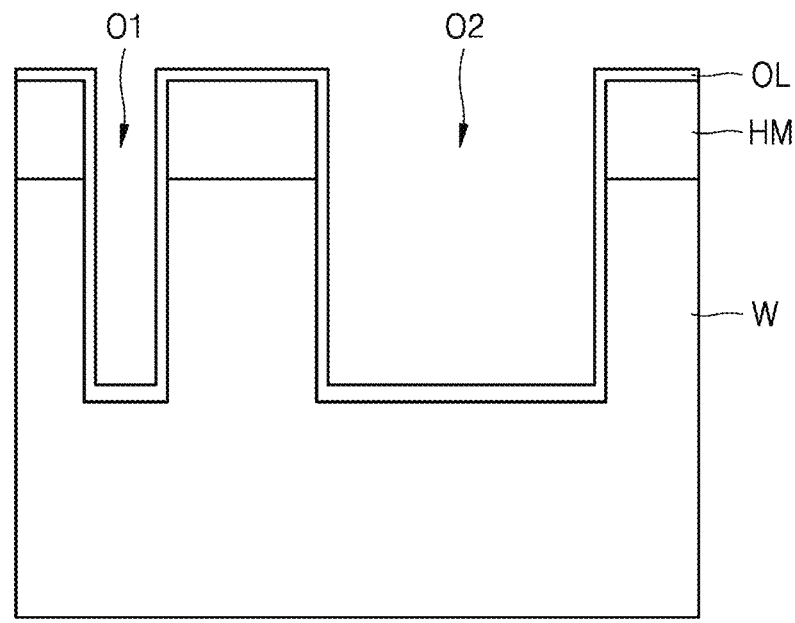
FIGS. 15A to 15C are cross-sectional views for explaining a method of fabricating a semiconductor device according to an example embodiment.
Figure 15B:
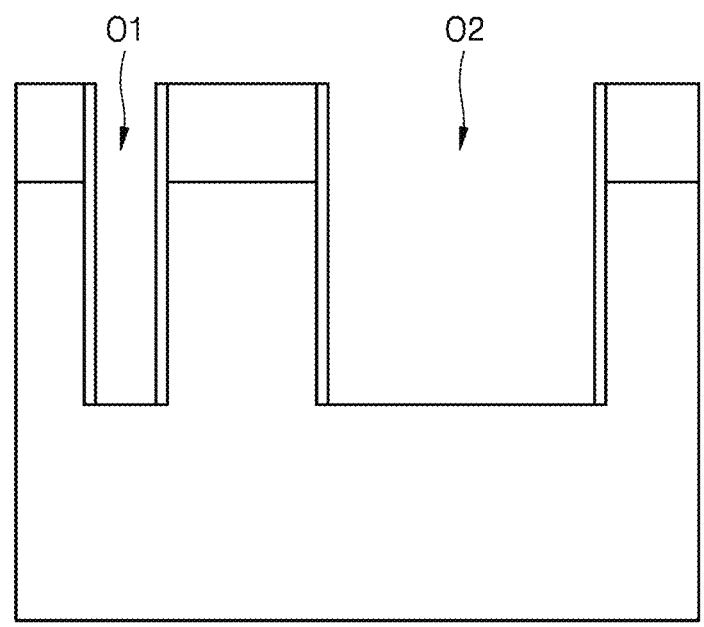
Figure 15C:
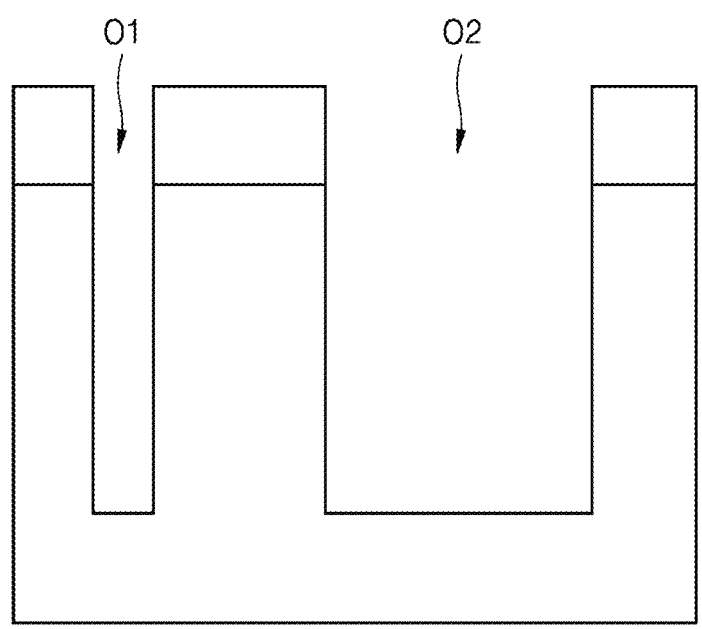

FIGS. 15A to 15C are cross-sectional views for explaining a method of fabricating a semiconductor device according to some embodiments.

Referring to FIGS. 10A, 13, and 14, in operation P110, a first atmosphere may be provided in the chamber CB.

The creating of the first atmosphere may include adjusting a type and a pressure of gas in the chamber CB. A type of plasma ions may vary according to the type of the gas, and a concentration of plasma ions may vary according to the pressure. The first atmosphere may satisfy a type and a pressure of gas suitable for removing a native oxide layer formed on the wafer. While the first atmosphere is being provided, the first and second power generators 1100 and 1200 may be turned off, and thus, the first and second output voltages VOUT1 and VOUT2 may be substantially 0 V.

Referring to FIGS. 10A and 13 to 15B, a first etching process may be performed in operation P120.

In order to perform the first etching process, a hard mask HM may be formed on the wafer W, and a native oxide layer OL may be formed on a surface of the wafer W. As shown in FIG. 15B, the first etching process may be an anisotropic etching process of removing the native oxide layer OL to expose bottom surfaces of openings O1 and O2 in the wafer W. While the first etching process is being performed, the first power generator 1100 may apply the first voltage VOUT1, which is RF power, to the top electrode TE, and the first power generator 1100 may apply the second voltage VOUT2, which is a non-sinusoidal periodic wave, to the bottom electrode BE.

Referring to FIGS. 10A, 13 and 14, in operation P130, a second atmosphere may be provided in the chamber CB. The second atmosphere may satisfy a type and a pressure of gas suitable for performing a plasma induced oxidation process on the wafer. While the second atmosphere is being provided, the first and second power generators 1100 and 1200 may be turned off, and thus, the first and second output voltages VOUT1 and VOUT2 may be substantially 0 V.

Referring to FIGS. 10A, 13, and 14, an oxidation process may be performed in operation P140. The oxidation process may prevent sidewalls of the first and second openings O1 and O2 (see FIG. 15B) from being damaged in a subsequent second etching process.

While the oxidation process is being performed, the first power generator 1100 may generate plasma by applying the first output voltage VOUT1, which is RF power, to the top electrode. The amplitude of the first output voltage VOUT1 at P140 is shown as lower than the amplitude of the first output voltage VOUT1 at P120, but is not limited thereto. The second power generator 1200 may be turned off.

Referring to FIGS. 10A, 13, and 14, in operation P150, a third atmosphere may be provided in the chamber CB. The third atmosphere may satisfy, for example, a type and a pressure of gas suitable for etching polysilicon. While the third atmosphere is being provided, the first and second power generators 1100 and 1200 may be turned off, and thus, the first and second output voltages VOUT1 and VOUT2 may be substantially 0 V.

Referring to FIGS. 10A and 13 to 15C, the second etching process may be performed in operation P160.

The second etching process may be a substantial etching process using the hard mask HM as an etching mask. In the second etching process, any one of a polysilicon layer, a dielectric layer, and a metal layer may be etched. While the second etching process is being performed, the first power generator 1100 may apply the first voltage VOUT1, which is RF power, to the top electrode TE, and the first power generator 1100 may apply the second voltage VOUT2, which is a non-sinusoidal periodic wave, to the bottom electrode BE.

According to an example embodiment, the amplitude of the first voltage VOUT1 in operation P160 may be greater than the amplitude of the first voltage VOUT1 in operation P120. Accordingly, a concentration of plasma in the second etching process may be greater than a concentration of plasma in the first etching process.)

According to an example embodiment, the amplitude of the second voltage VOUT2 in operation P160 may be greater than the amplitude of the second voltage VOUT2 at P120. In the case where the voltage waveform generator 100 of FIG. 1 is used as the second power generator 1200, the pulse circuit 110*a* may charge the first internal current IL1 to allow the first internal current IL1 to have a greater value in operation P160 than in operation P120. In the case where the voltage waveform generator 200 of FIG. 8 or the voltage waveform generator 300 of FIG. 9 is used as the second power generator 1200, the first pulse circuits 210*a* and 310*a* may apply the first output current IO1 to the chamber CB in operation P120, and the second pulse circuits 210*c* and 310*c* may apply the third output current IO3 to the chamber CB in operation P160.

According to an example embodiment, a gradient of a slope of the second output voltage VOUT2 in operation P120 may be different from a gradient of a slope of the second output voltage VOUT2 in operation P160. In the case where the voltage waveform generator 100 of FIG. 1 or the voltage waveform generator 200 of FIG. 8 is used as the second power generator 1200, the slope circuits 110*b* and 210*b* may charge the second internal current IL2 to allow the second internal current IL2 to have a higher value in operation P160 than in operation P120.

In the case where the voltage waveform generator 300 of FIG. 9 is used as the second power generator 1200, the first slope circuit 310*b* may apply the second output current IO2 to the chamber CB in operation P120, and the second slope circuit 310*d* may apply the fourth output current IO4 to the chamber CB in operation P160. The fourth output current IO4 may be different from the second output current IO2.

According example embodiments, operations P110 to P160 of the plasma process for manufacturing a semiconductor device may be repeated in sequence until an etching target (for example, the wafer W) is etched to achieve desired dimensions.

While the inventive concept has been particularly shown and described with reference to embodiments thereof, it will be understood that various changes in form and details may be made therein without departing from the spirit and scope of the following claims.

What is claimed is:

1. A wafer processing apparatus comprising:
a chamber configured to load a wafer;
a radio frequency (RF) power source configured to generate plasma ions in the chamber; and
a voltage waveform generator configured to accelerate the plasma ions toward the wafer,
wherein the voltage waveform generator comprises:
a pulse circuit comprising a first inductive element configured to store a first internal current, the pulse circuit being configured to apply a pulse voltage to the chamber by adjusting a chamber current applied to the chamber; and
a slope circuit configured to generate a slope in an on-duty of the pulse voltage,
wherein the pulse circuit and the slope circuit are electrically connected in parallel to an input terminal of the chamber, and
wherein the pulse circuit comprises a first current discharging circuit comprising:
a first switch, a first diode, a second switch and a second diode arranged in series in a first path configured to allow the first internal current to enter a first terminal of the chamber, and
a third switch, a third diode, a fourth switch and a fourth diode arranged in series in a second path configured to allow the first internal current to enter a second terminal of the chamber opposite to the first terminal.

2. The apparatus of claim 1, wherein the pulse circuit further comprises:
a first current charging circuit configured to charge the first internal current of the first inductive element; and
the first current discharging circuit configured to output a first output current to the chamber based on the first internal current of the first inductive element.

3. The apparatus of claim 2, wherein the first current discharging circuit is further configured to:
output the first output current, which is substantially same as the first internal current, or
output the first output current having an amplitude which is substantially same as an amplitude of the first internal current and a sign opposite to a sign of the first internal current.

4. The apparatus of claim 1, wherein the slope circuit is further configured to generate the slope by controlling the chamber current.

5. The apparatus of claim 1, wherein the slope circuit comprises a second inductive element configured to store a second internal current.

6. The apparatus of claim 5, wherein the second internal current is lower than the first internal current.

7. The apparatus of claim 5, wherein the voltage waveform generator further comprises:
a first current meter configured to measure the first internal current; and
a second current meter configured to measure the second internal current.

8. The apparatus of claim 7, wherein the pulse circuit is further configured to maintain an amplitude of the first internal current to be substantially constant based on a measured value of the first current meter, and
the slope circuit is further configured to maintain an amplitude of the second internal current to be substantially constant based on a measured value of the second current meter.

9. The apparatus of claim 5, wherein the slope circuit further comprises:
a second current charging circuit configured to charge the second internal current of the second inductive element; and
a second current discharging circuit configured to output a second output current to the chamber based on the second internal current of the second inductive element.

10. The apparatus of claim 9, wherein the second current discharging circuit is further configured to output the second output current, which is a negative current having a same amplitude as the first internal current.

11. A plasma processing apparatus comprising:
a chamber in which a plasma process is performed; and
a voltage waveform generator configured to apply a non-sinusoidal periodic wave voltage to the chamber,
wherein the voltage waveform generator comprises:
a pulse circuit configured to apply a pulse voltage to the chamber by applying a first output current to the chamber; and
a slope circuit configured to generate a slope in an on-duty of the pulse voltage, by applying a second output current to the chamber,
wherein the pulse circuit and the slope circuit are electrically connected in parallel to an input terminal of the chamber,
wherein the pulse circuit comprises a first current discharging circuit comprising:
a first switch, a first diode, a second switch and a second diode arranged in series in a first path configured to allow a first internal current to enter a first terminal of the chamber, and
a third switch, a third diode, a fourth switch and a fourth diode arranged in series in a second path configured to allow the first internal current to enter a second terminal of the chamber opposite to the first terminal.

12. The apparatus of claim 11, wherein the pulse circuit and the slope circuit are terminated two-port networks in which first output ports of the pulse circuit and second output ports of the slope circuit are electrically connected to each other in parallel.

13. The apparatus of claim 11, wherein the plasma process is one of plasma etching, plasma cleaning, or plasma deposition.

14. The apparatus of claim 11, wherein each of the pulse circuit and the slope circuit comprises a variable constant current source.

15. The apparatus of claim 11, wherein the pulse circuit comprises a first inductive element configured to store the first internal current, and
the slope circuit comprises a second inductive element configured to store a second internal current.

16. The apparatus of claim 15, wherein the second internal current is lower than the first internal current.

17. The apparatus of claim 15, wherein the pulse voltage is a non-sinusoidal periodic wave having a period comprising a first interval, a second interval, a third interval and a fourth interval,
the pulse circuit is further configured to cause the first internal current to freewheel in the pulse circuit, and the slope circuit is further configured to cause the second internal current to freewheel in the slope circuit, to allow the pulse voltage to be maintained to have a first voltage during the first interval,
the pulse circuit is further configured to apply the first internal current to the chamber to allow a chamber voltage to drop from the first voltage to a second voltage during the second interval, and
the slope circuit is further configured to apply the second internal current to the chamber to allow the chamber voltage to drop from the second voltage to a third voltage during the third interval.

18. The apparatus of claim 17, wherein the pulse circuit is further configured to apply the first internal current to the chamber in a direction opposite to a direction in which the first internal current is applied during the second interval, to allow the chamber voltage to increase from the third voltage to the first voltage during the fourth interval.

19. A plasma processing apparatus comprising
a voltage waveform generator configured to apply a chamber voltage which is a non-sinusoidal periodic wave to a plasma chamber, wherein the voltage waveform generator comprises:
a pulse circuit comprising a first inductive element configured to store a first internal current; and
a slope circuit comprising a second inductive element configured to store a second internal current,
wherein the pulse circuit is configured to apply the first internal current to the plasma chamber to generate a pulse in the chamber voltage, and the slope circuit is configured to apply the second internal current to the plasma chamber to generate a slope in an on-duty of the pulse
wherein the pulse circuit and the slope circuit are electrically connected in parallel to an input terminal of the plasma chamber, and
wherein the pulse circuit comprises a first current discharging circuit comprising:
a first switch, a first diode, a second switch and a second diode arranged in series in a first path configured to allow the first internal current to enter a first terminal of the plasma chamber, and
a third switch, a third diode, a fourth switch and a fourth diode arranged in series in a second path configured to allow the first internal current to enter a second terminal of the plasma chamber opposite to the first terminal.

20. The apparatus of claim 19, wherein the second internal current is lower than the first internal current.

* * * * *